US011710531B2

(12) United States Patent
Iizuka

(10) Patent No.: US 11,710,531 B2
(45) Date of Patent: Jul. 25, 2023

(54) MEMORY REDUNDANCY REPAIR

(71) Applicant: MICRON TECHNOLOGY, INC., Boise, ID (US)

(72) Inventor: Mariko Iizuka, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 59 days.

(21) Appl. No.: 17/110,407

(22) Filed: Dec. 3, 2020

(65) Prior Publication Data

US 2021/0202024 A1 Jul. 1, 2021

Related U.S. Application Data

(60) Provisional application No. 62/954,797, filed on Dec. 30, 2019.

(51) Int. Cl.
| | | |
|---|---|---|
| *G11C 29/38* | (2006.01) | |
| *G11C 29/44* | (2006.01) | |
| *G11C 15/04* | (2006.01) | |
| *G11C 29/54* | (2006.01) | |

(52) U.S. Cl.
CPC .............. *G11C 29/38* (2013.01); *G11C 15/04* (2013.01); *G11C 29/4401* (2013.01)

(58) Field of Classification Search
None
See application file for complete search history.

(56) References Cited

U.S. PATENT DOCUMENTS

| | | | | | |
|---|---|---|---|---|---|
| 4,358,833 | A | * | 11/1982 | Folmsbee | ............ G11C 29/832 714/710 |
| 4,488,220 | A | * | 12/1984 | Friedli | ..................... B66B 1/468 710/49 |
| 5,083,294 | A | * | 1/1992 | Okajima | ............... G11C 29/808 365/210.12 |
| 5,185,744 | A | * | 2/1993 | Arimoto | ................. G11C 29/40 714/719 |
| 5,495,445 | A | * | 2/1996 | Proebsting | ............... G11C 7/12 365/201 |
| 6,259,637 | B1 | * | 7/2001 | Wood | .................. G11C 29/4401 365/201 |

(Continued)

FOREIGN PATENT DOCUMENTS

WO 2007/041185 A2 4/2007

*Primary Examiner* — April Y Blair
*Assistant Examiner* — Dipakkumar B Gandhi
(74) *Attorney, Agent, or Firm* — Dicke, Billig & Czaja, PLLC

(57) ABSTRACT

Memories, and their operation, might include a plurality of content addressable memory (CAM) cells each for storing a respective data value, a match signal generator configured to generate an indication whether each CAM cell of the plurality of CAM cells indicates a match between its respective data value and a respective received signal value, and a plurality of storage elements each for storing a respective data value, wherein each storage element of the plurality of storage elements corresponds to a respective CAM cell of the plurality of CAM cells in a one-to-one relationship, and wherein each storage element of the plurality of storage elements is responsive to the indication of the match signal generator to generate a data signal indicative of the respective data value of that storage element if a match of their corresponding CAM cells is indicated.

21 Claims, 12 Drawing Sheets

(56) References Cited

U.S. PATENT DOCUMENTS

| | | | |
|---|---|---|---|
| 6,259,639 B1* | 7/2001 | Hashizume | G11C 29/44 |
| | | | 365/201 |
| 6,320,782 B1* | 11/2001 | Takashima | G11C 11/5657 |
| | | | 257/E27.104 |
| 6,421,286 B1* | 7/2002 | Ohtani | G11C 29/44 |
| | | | 365/201 |
| 7,317,647 B2 | 1/2008 | Ha | |
| 7,724,592 B2 | 5/2010 | Nobunaga et al. | |
| 8,085,568 B1* | 12/2011 | Fabry | G11C 15/04 |
| | | | 365/49.16 |
| 2003/0223282 A1* | 12/2003 | McClure | G11C 29/846 |
| | | | 365/200 |
| 2007/0103998 A1* | 5/2007 | Ishikawa | G11C 29/76 |
| | | | 365/200 |
| 2007/0291560 A1* | 12/2007 | Hsieh | G11C 29/4401 |
| | | | 365/201 |
| 2013/0051167 A1* | 2/2013 | Iwai | G11C 29/785 |
| | | | 365/230.06 |
| 2015/0293710 A1* | 10/2015 | Kinoshita | G06F 12/00 |
| | | | 711/114 |

* cited by examiner

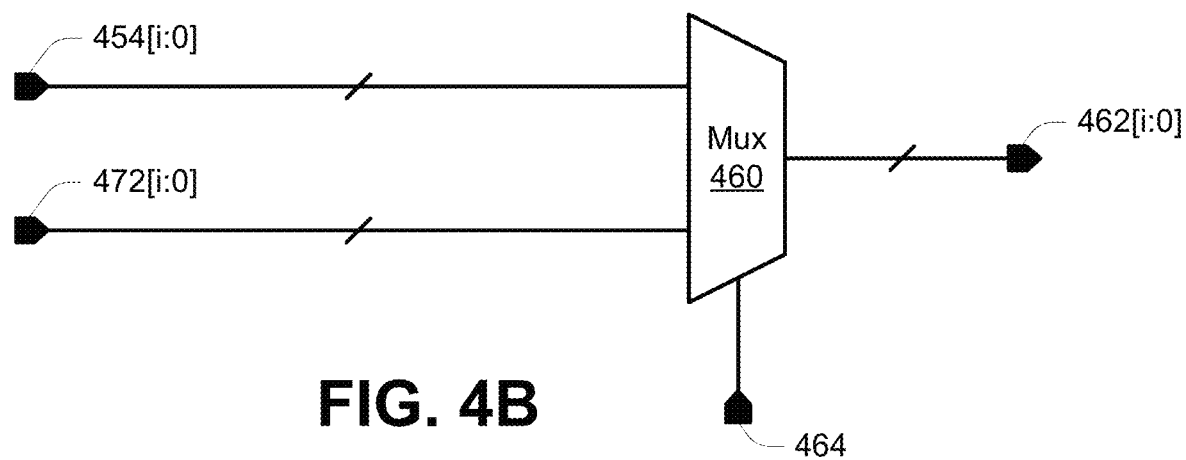
FIG. 4B
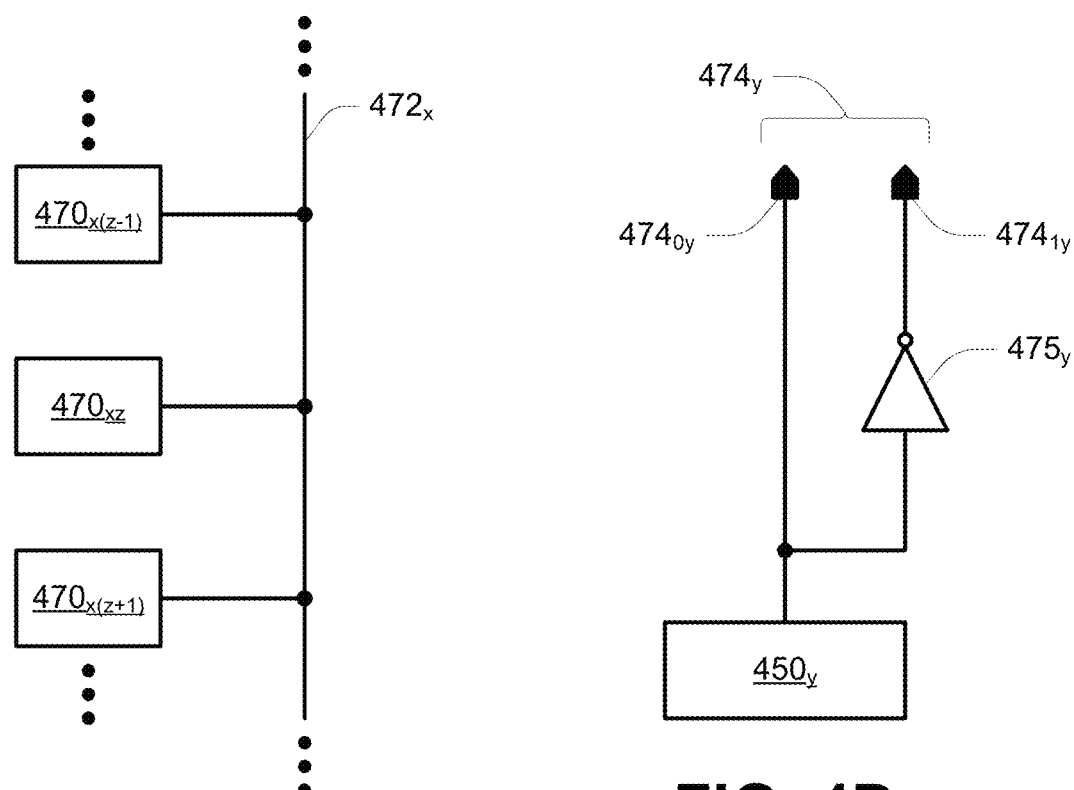
FIG. 4C
FIG. 4D

MEMORY REDUNDANCY REPAIR

RELATED APPLICATION

This application claims the benefit of U.S. Provisional Application No. 62/954,797, filed on Dec. 30, 2019, hereby incorporated herein in its entirety by reference.

TECHNICAL FIELD

The present disclosure relates generally to integrated circuits, and, in particular, in one or more embodiments, the present disclosure relates to circuitry and methods for redundancy repair in a memory.

BACKGROUND

Integrated circuit devices traverse a broad range of electronic devices. One particular type includes memory devices, oftentimes referred to simply as memory. Memory devices are typically provided as internal, semiconductor, integrated circuit devices in computers or other electronic devices. There are many different types of memory including random-access memory (RAM), read only memory (ROM), dynamic random access memory (DRAM), synchronous dynamic random access memory (SDRAM), and flash memory.

Flash memory has developed into a popular source of non-volatile memory for a wide range of electronic applications. Flash memory typically use a one-transistor memory cell that allows for high memory densities, high reliability, and low power consumption. Changes in threshold voltage (Vt) of the memory cells, through programming (which is often referred to as writing) of charge storage structures (e.g., floating gates or charge traps) or other physical phenomena (e.g., phase change or polarization), determine the data state (e.g., data value) of each memory cell. Common uses for flash memory and other non-volatile memory include personal computers, personal digital assistants (PDAs), digital cameras, digital media players, digital recorders, games, appliances, vehicles, wireless devices, mobile telephones, and removable memory modules, and the uses for non-volatile memory continue to expand.

A NAND flash memory is a common type of flash memory device, so called for the logical form in which the basic memory cell configuration is arranged. Typically, the array of memory cells for NAND flash memory is arranged such that the control gate of each memory cell of a row of the array is connected together to form an access line, such as a word line. Columns of the array include strings (often termed NAND strings) of memory cells connected together in series between a pair of select gates, e.g., a source select transistor and a drain select transistor. Each source select transistor might be connected to a source, while each drain select transistor might be connected to a data line, such as column bit line. Variations using more than one select gate between a string of memory cells and the source, and/or between the string of memory cells and the data line, are known.

Although fabrication technologies continue to improve, defects during fabrication are generally inevitable. Moreover, as memory sizes continue to increase and feature sizes continue to decrease, the number of such fabrication defects might tend to increase. To maintain production yields in the face of such defects, redundancy is commonly implemented in the fabrication of memory.

Redundancy is a method of incorporating spare or redundant memory elements that can be used to replace defective memory elements. As an example, a memory may have redundant columns of memory cells. If a memory cell is determined to be defective, the column of memory cells containing the defective memory cell might be replaced by a redundant column of memory cells by redirecting the address of the column containing the defective memory cell to the redundant column. This process is generally transparent to an end user of the memory.

BRIEF DESCRIPTION OF THE DRAWINGS

FIGS. 4A-4D are block schematics of repair logic and control circuitry in accordance with embodiments.

DETAILED DESCRIPTION

Figure 1:
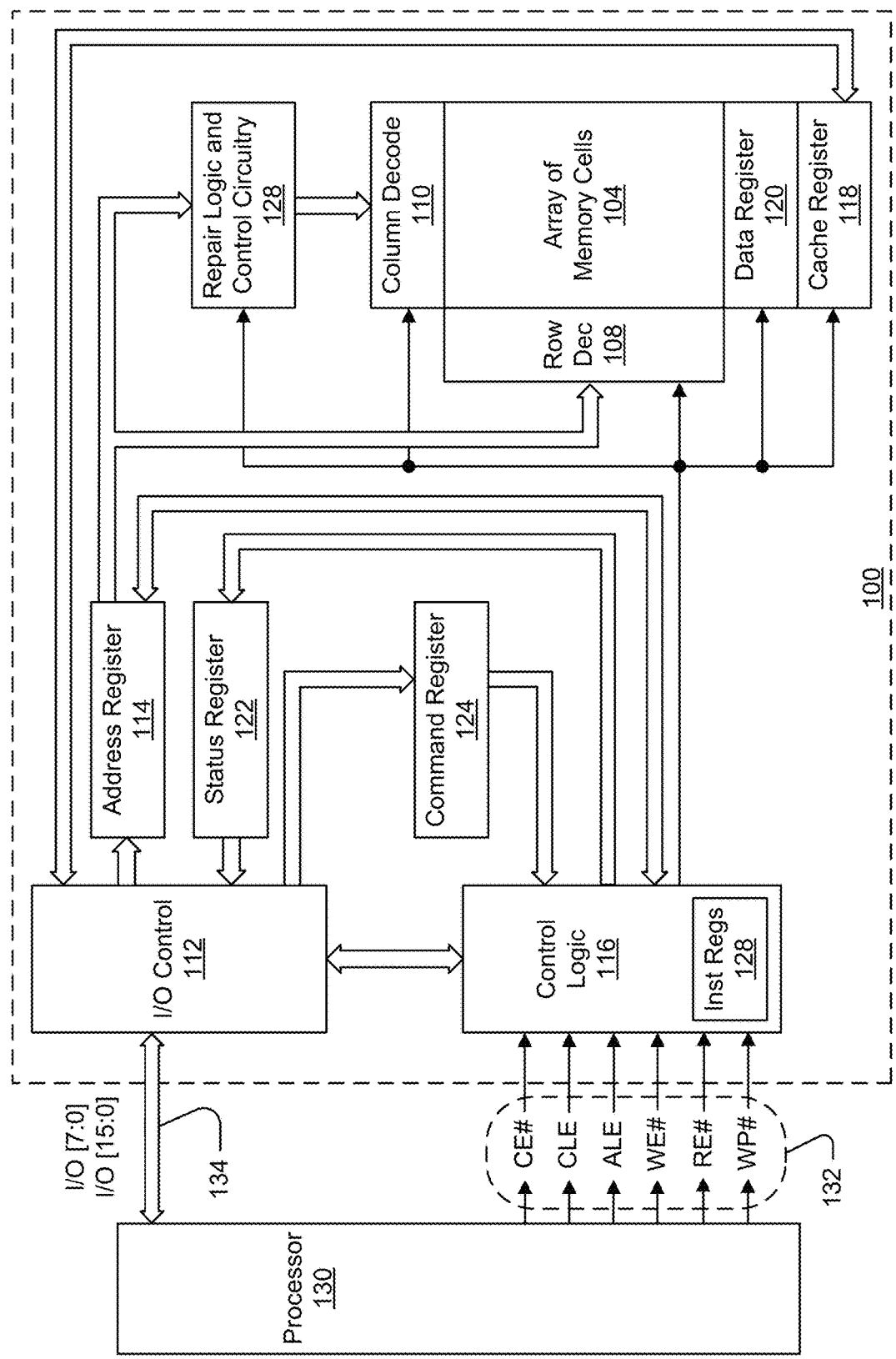
FIG. 1 is a simplified block diagram of a memory in communication with a processor as part of an electronic system, according to an embodiment.

In the following detailed description, reference is made to the accompanying drawings that form a part hereof, and in which is shown, by way of illustration, specific embodiments. In the drawings, like reference numerals describe substantially similar components throughout the several views. Other embodiments might be utilized and structural, logical and electrical changes might be made without departing from the scope of the present disclosure. The following detailed description is, therefore, not to be taken in a limiting sense.

The term "semiconductor" used herein can refer to, for example, a layer of material, a wafer, or a substrate, and includes any base semiconductor structure. "Semiconductor" is to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a semiconductor in the following description, previous process steps might have been utilized to form regions/junctions in the base semiconductor structure, and the term semiconductor can include the underlying layers containing such regions/junctions.

The term "conductive" as used herein, as well as its various related forms, e.g., conduct, conductively, conducting, conduction, conductivity, etc., refers to electrically conductive unless otherwise apparent from the context. Similarly, the term "connecting" as used herein, as well as its various related forms, e.g., connect, connected, connection, etc., refers to electrically connecting unless otherwise apparent from the context.

FIG. 1 is a simplified block diagram of a first apparatus, in the form of a memory (e.g., memory device) 100, in communication with a second apparatus, in the form of a processor 130, as part of a third apparatus, in the form of an electronic system, according to an embodiment. Some examples of electronic systems include personal computers, personal digital assistants (PDAs), digital cameras, digital media players, digital recorders, games, appliances, vehicles, wireless devices, mobile telephones and the like. The processor 130, e.g., a controller external to the memory device 100, might be a memory controller or other external host device.

Memory device 100 includes an array of memory cells 104 logically arranged in rows and columns. Memory cells of a logical row are typically connected to the same access line (commonly referred to as a word line) while memory cells of a logical column are typically selectively connected to the same data line (commonly referred to as a bit line). A single access line might be associated with more than one logical row of memory cells and a single data line might be associated with more than one logical column. Memory cells (not shown in FIG. 1) of at least a portion of array of memory cells 104 are capable of being programmed to one of at least two target data states.

A row decode circuitry 108 and a column decode circuitry 110 are provided to decode address signals. Address signals are received and decoded to access the array of memory cells 104. Memory device 100 also includes input/output (I/O) control circuitry 112 to manage input of commands, addresses and data to the memory device 100 as well as output of data and status information from the memory device 100. An address register 114 is in communication with I/O control circuitry 112 and row decode circuitry 108 and column decode circuitry 110 to latch the address signals prior to decoding. The address register 114 might further be in communication with a repair logic and control circuitry 128 in accordance with an embodiment. While the repair logic and control circuitry 128 is depicted to be in communication with the column decode circuitry 110 for redundancy repair of defective columns of memory cells, the concepts described herein could be equally applied to the redundancy repair of defective rows of memory cell. A command register 124 is in communication with I/O control circuitry 112 and control logic 116 to latch incoming commands.

A controller (e.g., the control logic 116 internal to the memory device 100) controls access to the array of memory cells 104 in response to the commands and generates status information for the external processor 130, i.e., control logic 116 is configured to perform access operations (e.g., sensing operations [which might include read operations and verify operations], programming operations and/or erase operations) on the array of memory cells 104. The control logic 116 is in communication with row decode circuitry 108 and column decode circuitry 110 to control the row decode circuitry 108 and column decode circuitry 110 in response to the addresses. The control logic 116 might include instruction registers 128 which might represent computer-usable memory for storing computer-readable instructions. For some embodiments, the instruction registers 128 might represent firmware. Alternatively, the instruction registers 128 might represent a grouping of memory cells, e.g., reserved block(s) of memory cells, of the array of memory cells 104.

Control logic 116 is also in communication with a cache register 118. Cache register 118 latches data, either incoming or outgoing, as directed by control logic 116 to temporarily store data while the array of memory cells 104 is busy writing or reading, respectively, other data. During a programming operation (e.g., write operation), data might be passed from the cache register 118 to the data register 120 for transfer to the array of memory cells 104; then new data might be latched in the cache register 118 from the I/O control circuitry 112. During a read operation, data might be passed from the cache register 118 to the I/O control circuitry 112 for output to the external processor 130; then new data might be passed from the data register 120 to the cache register 118. The cache register 118 and/or the data register 120 might form (e.g., might form a portion of) a page buffer of the memory device 100. A page buffer might further include sensing devices (not shown in FIG. 1) to sense a data state of a memory cell of the array of memory cells 104, e.g., by sensing a state of a data line connected to that memory cell. A status register 122 might be in communication with I/O control circuitry 112 and control logic 116 to latch the status information for output to the processor 130.

Memory device 100 receives control signals at control logic 116 from processor 130 over a control link 132. The control signals might include a chip enable CE #, a command latch enable CLE, an address latch enable ALE, a write enable WE #, a read enable RE #, and a write protect WP #. Additional or alternative control signals (not shown) might be further received over control link 132 depending upon the nature of the memory device 100. Memory device 100 receives command signals (which represent commands), address signals (which represent addresses), and data signals (which represent data) from processor 130 over a multiplexed input/output (I/O) bus 134 and outputs data to processor 130 over I/O bus 134.

For example, the commands might be received over input/output (I/O) pins [7:0] of I/O bus 134 at I/O control circuitry 112 and might then be written into command register 124. The addresses might be received over input/output (I/O) pins [7:0] of I/O bus 134 at I/O control circuitry 112 and might then be written into address register 114. The data might be received over input/output (I/O) pins [7:0] for an 8-bit device or input/output (I/O) pins [15:0] for a 16-bit device at I/O control circuitry 112 and then might be written into cache register 118. The data might be subsequently written into data register 120 for programming the array of memory cells 104. For another embodiment, cache register 118 might be omitted, and the data might be written directly into data register 120. Data might also be output over input/output (I/O) pins [7:0] for an 8-bit device or input/output (I/O) pins [15:0] for a 16-bit device. Although reference might be made to I/O pins, they might include any conductive node providing for electrical connection to the memory device 100 by an external device (e.g., processor 130), such as conductive pads or conductive bumps as are commonly used.

It will be appreciated by those skilled in the art that additional circuitry and signals can be provided, and that the memory device 100 of FIG. 1 has been simplified. It should be recognized that the functionality of the various block components described with reference to FIG. 1 might not necessarily be segregated to distinct components or component portions of an integrated circuit device. For example, a single component or component portion of an integrated circuit device could be adapted to perform the functionality of more than one block component of FIG. 1. Alternatively, one or more components or component portions of an integrated circuit device could be combined to perform the functionality of a single block component of FIG. 1.

Additionally, while specific I/O pins are described in accordance with popular conventions for receipt and output of the various signals, it is noted that other combinations or numbers of I/O pins (or other I/O node structures) might be used in the various embodiments.

Figure 2A:
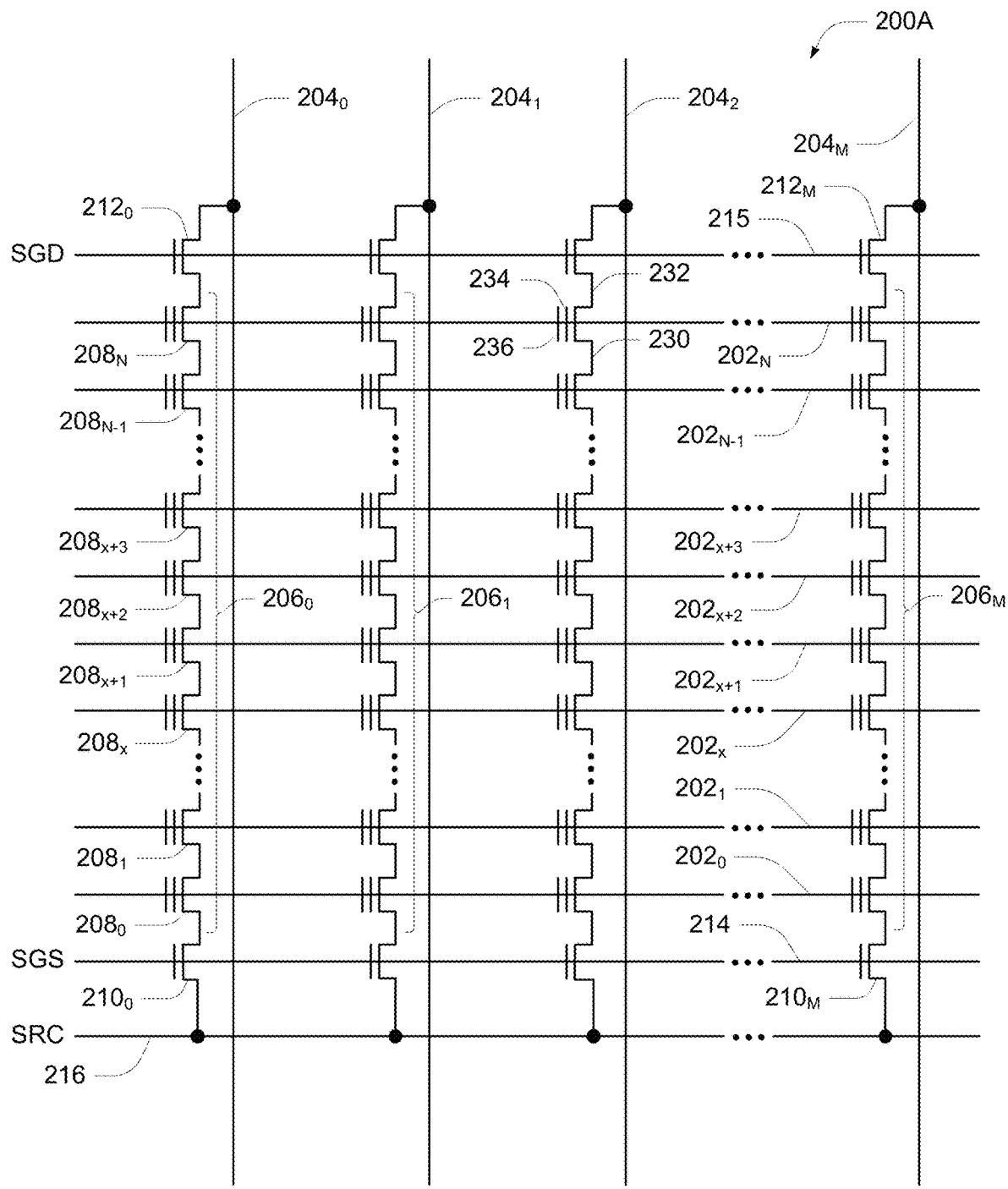
FIGS. 2A-2B are schematics of portions of an array of memory cells as could be used in a memory of the type described with reference to FIG. 1.

FIG. 2A is a schematic of a portion of an array of memory cells 200A, such as a NAND memory array, as could be used in a memory of the type described with reference to FIG. 1, e.g., as a portion of array of memory cells 104. Memory array 200A includes access lines, such as word lines $202_0$ to $202_N$, and data lines, such as bit lines $204_0$ to $204_M$. The word lines 202 might be connected to global access lines (e.g., global word lines), not shown in FIG. 2A, in a many-to-one relationship. For some embodiments, memory array 200A might be formed over a semiconductor that, for example, might be conductively doped to have a conductivity type, such as a p-type conductivity, e.g., to form a p-well, or an n-type conductivity, e.g., to form an n-well.

Memory array 200A might be arranged in rows (each corresponding to a word line 202) and columns (each corresponding to a bit line 204). Each column might include a string of series-connected memory cells (e.g., non-volatile memory cells), such as one of NAND strings $206_0$ to $206_M$. Each NAND string 206 might be connected (e.g., selectively connected) to a common source (SRC) 216 and might include memory cells $208_0$ to $208_N$. The memory cells 208 might represent non-volatile memory cells for storage of data. The memory cells 208 of each NAND string 206 might be connected in series between a select gate 210 (e.g., a field-effect transistor), such as one of the select gates $210_0$ to $210_M$ (e.g., that might be source select transistors, commonly referred to as select gate source), and a select gate 212 (e.g., a field-effect transistor), such as one of the select gates $212_0$ to $212_M$ (e.g., that might be drain select transistors, commonly referred to as select gate drain). Select gates $210_0$ to $210_M$ might be commonly connected to a select line 214, such as a source select line (SGS), and select gates $212_0$ to $212_M$ might be commonly connected to a select line 215, such as a drain select line (SGD). Although depicted as traditional field-effect transistors, the select gates 210 and 212 might utilize a structure similar to (e.g., the same as) the memory cells 208. The select gates 210 and 212 might represent a plurality of select gates connected in series, with each select gate in series configured to receive a same or independent control signal.

A source of each select gate 210 might be connected to common source 216. The drain of each select gate 210 might be connected to a memory cell $208_0$ of the corresponding NAND string 206. For example, the drain of select gate $210_0$ might be connected to memory cell $208_0$ of the corresponding NAND string $206_0$. Therefore, each select gate 210 might be configured to selectively connect a corresponding NAND string 206 to common source 216. A control gate of each select gate 210 might be connected to select line 214.

The drain of each select gate 212 might be connected to the bit line 204 for the corresponding NAND string 206. For example, the drain of select gate $212_0$ might be connected to the bit line $204_0$ for the corresponding NAND string $206_0$. The source of each select gate 212 might be connected to a memory cell $208_N$ of the corresponding NAND string 206. For example, the source of select gate $212_0$ might be connected to memory cell $208_N$ of the corresponding NAND string $206_0$. Therefore, each select gate 212 might be configured to selectively connect a corresponding NAND string 206 to the corresponding bit line 204. A control gate of each select gate 212 might be connected to select line 215.

The memory array in FIG. 2A might be a quasi-two-dimensional memory array and might have a generally planar structure, e.g., where the common source 216, NAND strings 206 and bit lines 204 extend in substantially parallel planes. Alternatively, the memory array in FIG. 2A might be a three-dimensional memory array, e.g., where NAND strings 206 might extend substantially perpendicular to a plane containing the common source 216 and to a plane containing the bit lines 204 that might be substantially parallel to the plane containing the common source 216.

Typical construction of memory cells 208 includes a data-storage structure 234 (e.g., a floating gate, charge trap, or other structure configured to store charge) that can determine a data state of the memory cell (e.g., through changes in threshold voltage), and a control gate 236, as shown in FIG. 2A. The data-storage structure 234 might include both conductive and dielectric structures while the control gate 236 is generally formed of one or more conductive materials. In some cases, memory cells 208 might further have a defined source/drain (e.g., source) 230 and a defined source/drain (e.g., drain) 232. Memory cells 208 have their control gates 236 connected to (and in some cases form) a word line 202.

A column of the memory cells 208 might be a NAND string 206 or a plurality of NAND strings 206 selectively connected to a given bit line 204. A row of the memory cells 208 might be memory cells 208 commonly connected to a given word line 202. A row of memory cells 208 can, but need not, include all memory cells 208 commonly connected to a given word line 202. Rows of memory cells 208 might often be divided into one or more groups of physical pages of memory cells 208, and physical pages of memory cells 208 often include every other memory cell 208 commonly connected to a given word line 202. For example, memory cells 208 commonly connected to word line $202_N$ and selectively connected to even bit lines 204 (e.g., bit lines $204_0$, $204_2$, $204_4$, etc.) might be one physical page of memory cells 208 (e.g., even memory cells) while memory cells 208 commonly connected to word line $202_N$ and selectively connected to odd bit lines 204 (e.g., bit lines $204_1$, $204_3$, $204_5$, etc.) might be another physical page of memory cells 208 (e.g., odd memory cells). Although bit lines $204_3$-$204_5$ are not explicitly depicted in FIG. 2A, it is apparent from the figure that the bit lines 204 of the array of memory cells 200A might be numbered consecutively from bit line $204_0$ to bit line $204_M$. Other groupings of memory cells 208 commonly connected to a given word line 202 might also define a physical page of memory cells 208. For certain memory devices, all memory cells commonly connected to a given word line might be deemed a physical page of memory cells. The portion of a physical page of memory cells (which, in some embodiments, could still be the entire row) that is read during a single read operation or programmed during a single programming operation (e.g., an upper or lower page of memory cells) might be deemed a logical page of memory cells. A block of memory cells might include those memory cells that are configured to be erased together, such as all memory cells connected to word lines $202_0$-$202_N$ (e.g., all NAND strings 206 sharing common word lines 202). Unless expressly distinguished, a reference to a page of memory cells herein refers to the memory cells of a logical page of memory cells.

Although the example of FIG. 2A is discussed in conjunction with NAND flash, the embodiments and concepts described herein are not limited to a particular array architecture or structure, and can include other structures (e.g., SONOS or other data storage structure configured to store charge) and other architectures (e.g., AND arrays, NOR arrays, etc.).

Figure 2B:
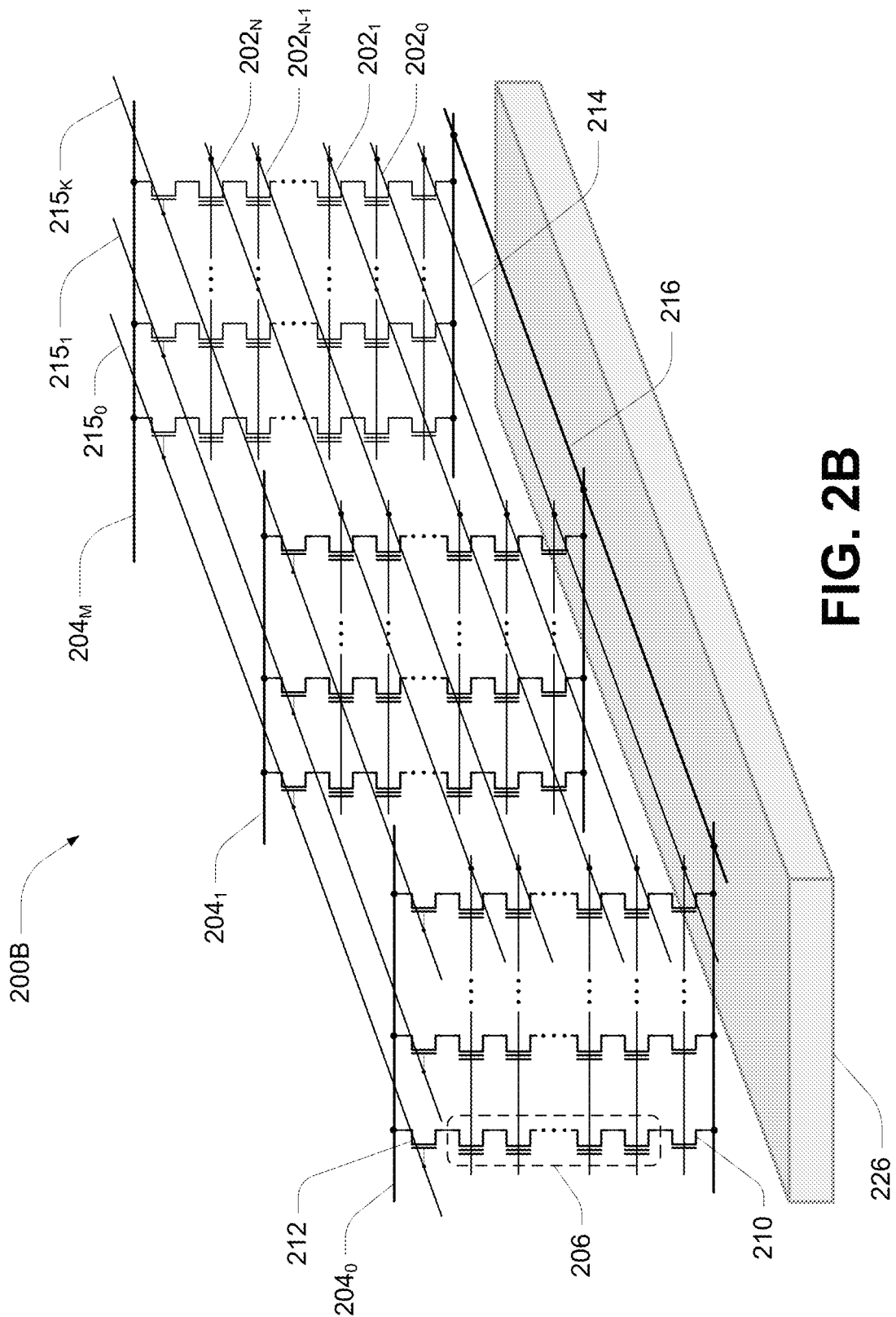

FIG. 2B is another schematic of a portion of an array of memory cells 200B as could be used in a memory of the type described with reference to FIG. 1, e.g., as a portion of array of memory cells 104. Like numbered elements in FIG. 2B correspond to the description as provided with respect to FIG. 2A. FIG. 2B provides additional detail of one example of a three-dimensional NAND memory array structure. The three-dimensional NAND memory array 200B might incorporate vertical structures which might include semiconductor pillars where a portion of a pillar might act as a channel region of the memory cells of NAND strings 206. The NAND strings 206 might be each selectively connected to a bit line $204_0$-$204_M$ by a select transistor 212 (e.g., that might be drain select transistors, commonly referred to as select gate drain) and to a common source 216 by a select transistor 210 (e.g., that might be source select transistors, commonly referred to as select gate source). Multiple NAND strings 206 might be selectively connected to the same bit line 204. Subsets of NAND strings 206 can be connected to their respective bit lines 204 by biasing the select lines $215_0$-$215_K$ to selectively activate particular select transistors 212 each between a NAND string 206 and a bit line 204. The select transistors 210 can be activated by biasing the select line 214. Each word line 202 might be connected to multiple rows of memory cells of the memory array 200B. Rows of memory cells that are commonly connected to each other by a particular word line 202 might collectively be referred to as tiers.

The three-dimensional NAND memory array 200B might be formed over peripheral circuitry 226. The peripheral circuitry 226 might represent a variety of circuitry for accessing the memory array 200B. The peripheral circuitry 226 might include complementary circuit elements. For example, the peripheral circuitry 226 might include both n-channel and p-channel transistors formed on a same semiconductor substrate, a process commonly referred to as CMOS, or complementary metal-oxide-semiconductors. Although CMOS often no longer utilizes a strict metal-oxide-semiconductor construction due to advancements in integrated circuit fabrication and design, the CMOS designation remains as a matter of convenience. The repair logic and control circuitry might represent a portion of the peripheral circuitry 226.

As arrays of memory cells increase in memory density, e.g., increasing numbers of memory cells for a given area of an integrated circuit die, demands placed on the area within the peripheral circuitry 226 might also increase. Repair logic and control circuitry has traditionally taken a large portion of the peripheral circuitry of a memory. Various embodiments seek to facilitate a reduction in size of the repair logic and control circuitry, while providing similar functionality for redundancy repair of a memory.

Figure 3A:
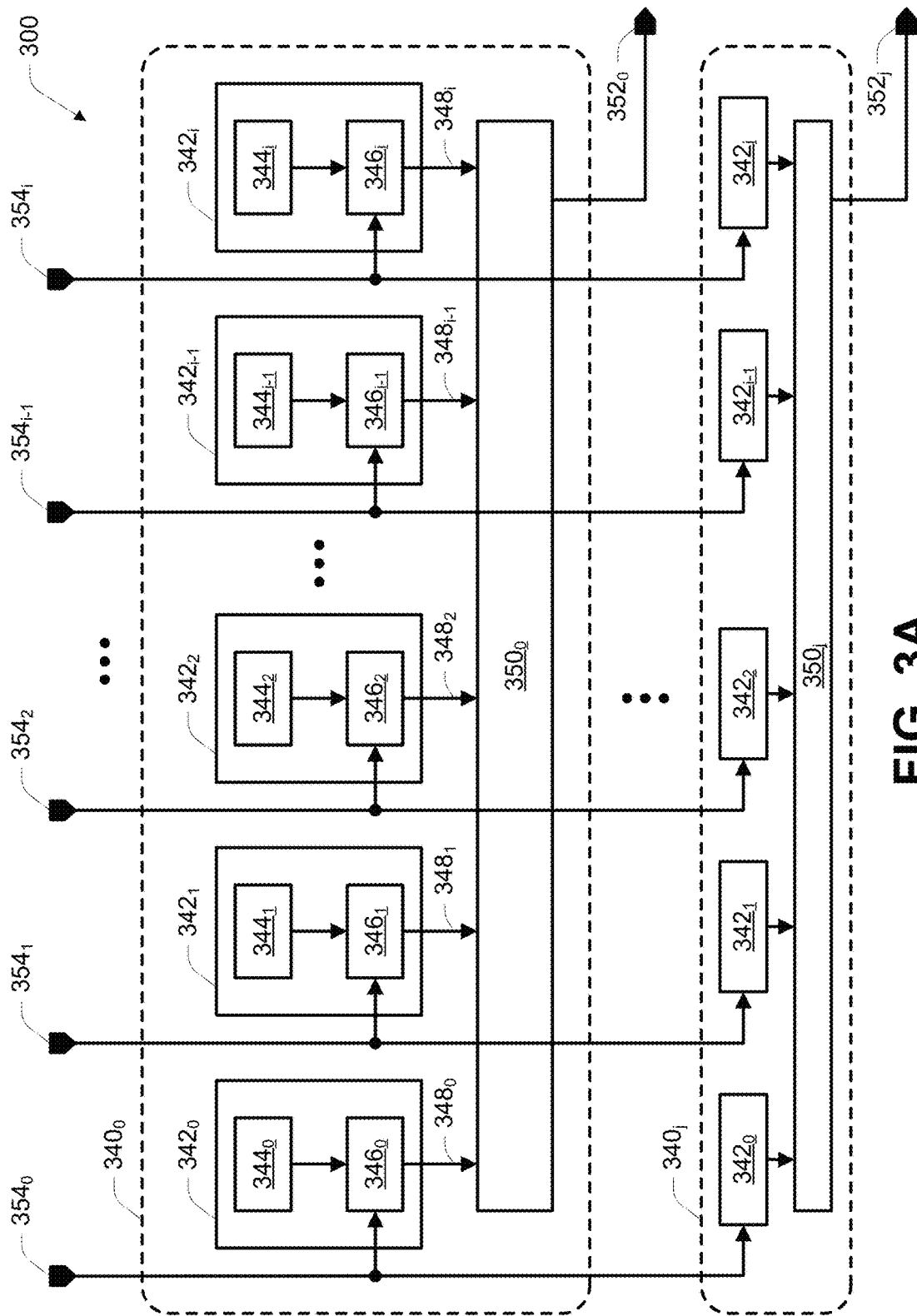
FIGS. 3A-3B are block schematics of repair logic and control circuitry of the related art.
Figure 3B:
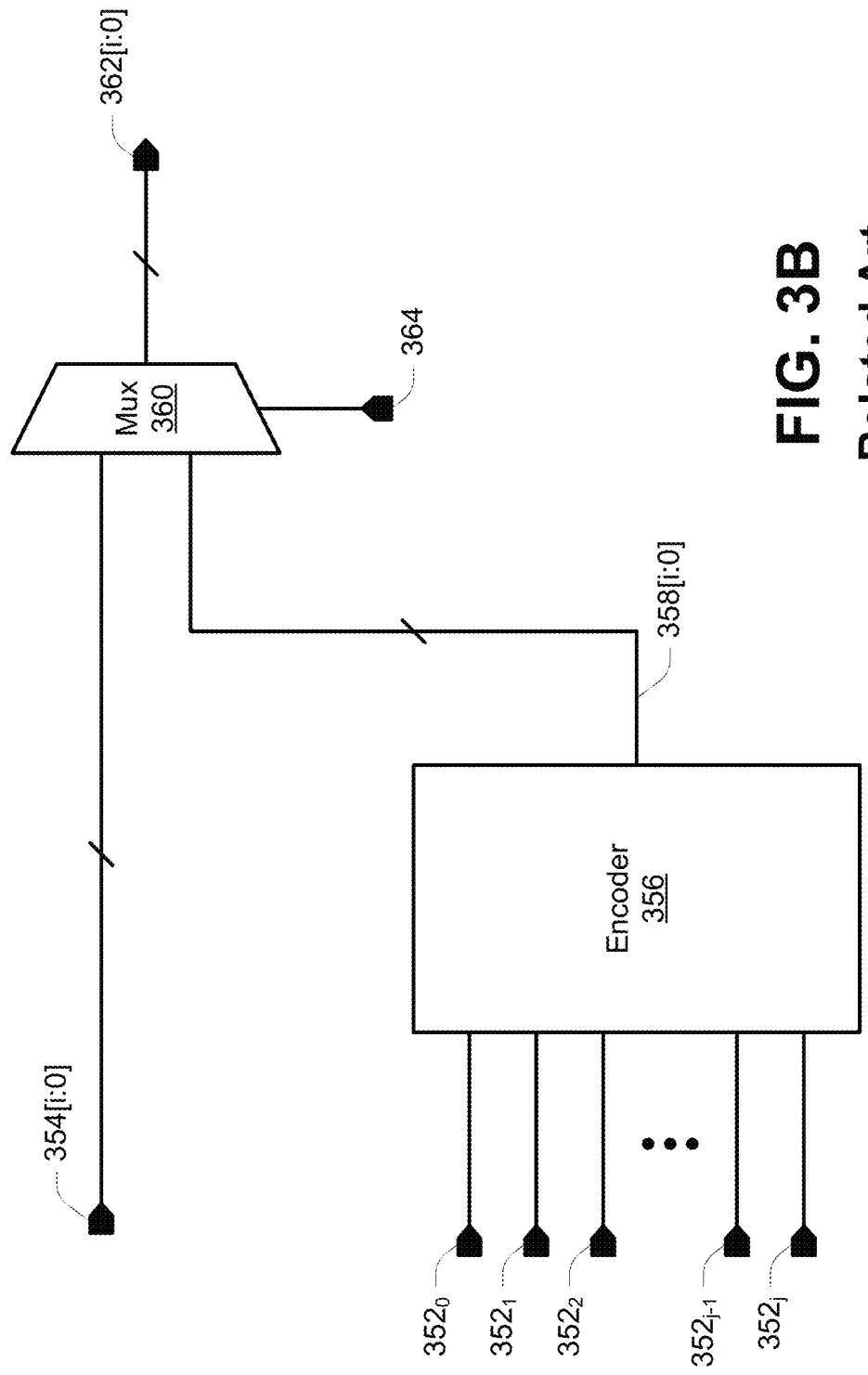

FIGS. 3A-3B are block schematics of repair logic and control circuitry of the related art. FIG. 3A depicts an array of content-addressable memory (CAM) cells 300 as a portion of a repair logic and control circuitry of the related art. The array of CAM cells 300 might have a number of rows 340, e.g., rows $340_0$ to $340_j$, where j is any natural number, i.e., a non-negative integer value. Each row 340 of the array of CAM cells 300 might include a number of CAM cells 342, e.g., CAM cells $342_0$ to $342_i$, wherein i is any natural number. In general, the value of i might be selected such that i+1 is equal to a number of digits of an address portion to be stored to the array of CAM cells 300. For example, for column redundancy, the address portion might correspond to the column address of the memory cells to be accessed.

The CAM cells 342 generally might each be configured to store a data value, e.g., corresponding to a digit of an address signal, and to provide an output signal having a logic level representative of whether or not a received signal value matches the stored data value. For example, each CAM cell 342 might include a register 344, e.g., registers $344_0$ to $344_i$, in communication with, e.g., connected to, a corresponding compare logic 346, e.g., compare logic $346_0$ to $346_i$, respectively. Each compare logic 346 might be connected to receive a signal value from a corresponding signal node 354, e.g., signal nodes $354_0$ to $354_i$, respectively. The signal nodes 354, which might be referred to as signal nodes 354[i:0], might each be connected to receive a corresponding digit of an address signal, such as from the address register 114 of FIG. 1, for example. Each compare logic 346 might be configured to generate a signal at its output 348, e.g., outputs $348_0$ to $348_i$, respectively, having a first logic level if the data value (e.g., logic level) stored in its register 344 is deemed to be the same as (e.g., equal to) a signal value (e.g., logic level) received from its corresponding signal node 354 (referred to as a match), and a second logic level, different than (e.g., opposite of) its first logic level, if the data value stored in its register 344 is deemed to be different than the signal value received from its corresponding signal node 354 (referred to as a mis-match). For example, each compare logic 346 might represent an XOR gate or an XNOR gate.

Programming the registers 344 of one or more rows 340 might include accessing (e.g., reading) a particular portion of an array of memory cells 104 storing address portions corresponding to defective memory elements. In general, testing of a memory might be used to determine which memory elements are deemed to be usable, and which are deemed to be defective. When a memory element is deemed to be defective, an address portion corresponding to that memory element might be stored to a non-volatile storage location of the memory, e.g., the array of memory cells 104. These address portions might then be accessed during power-up of the memory to program the registers 344 accordingly.

The outputs 348 of each CAM cell 342 of a row 340 of the array of CAM cells 300 might be connected to a match signal generator 350 corresponding to that row 340. Each row $340_0$ to $340_j$ might have a corresponding match signal generator 350, e.g., match signal generators $350_0$ to $350_j$, respectively, in the same manner as depicted in row $340_0$. Each match signal generator 350 might be configured to generate a signal at its output 352, e.g., outputs $352_0$ to $352_j$, respectively, having a first logic level if each of the outputs 348 of its corresponding CAM cells 342 indicates a match, and having a second logic level, different than (e.g., opposite of) its first logic level if any of the outputs 348 of its corresponding CAM cells 342 indicates a mis-match. Note that the first logic level for the output 352 of a match signal generator 350 might be the same as, or different from, the first logic level for the output 348 of a CAM cell 342. Each row 340 of the array of CAM cells 300 might be configured in a same manner as depicted with regard to row $340_0$, with each compare logic $346_0$ to 346, connected to its corresponding signal node $354_0$ to $354_i$, respectively.

In practice, an address portion for a corresponding defective memory element, e.g., a column of memory cells containing one or more memory cells identified as being defective, might be stored in the CAM cells 342 of a row 340 of the array of CAM cells 300. Each row 340 of the array of CAM cells 300 might store a different address portion, each corresponding to a different defective memory element. It is noted that where a number of identified defective memory elements is less than the number of rows 340 of the array of CAM cells 300, one or more of the rows 340 might not store any address portion, but might instead store values not corresponding to any accessible address. For example, values of all logic low levels or all logic high levels might not correspond to any address to be received on the signal nodes 354. In this manner, a row 340 of the array of CAM cells 300 not corresponding to a defective memory element might be configured to always indicate a mis-match in response to an address received on the signal nodes 354.

Each row 340 storing an address portion might further correspond to a respective redundant memory element, and each redundant memory element might have a corresponding address portion outside of the address space, e.g., of the array of memory cells 104, that might be received on the signal nodes 354. For example, assuming i=7, valid addresses to be received from the signal nodes 354 might correspond to an address space contained in 00000000 to 01111111, while addresses for redundant memory elements might correspond to an address space beginning with 10000000. With each row 340 storing a different address portion, or not storing any valid address portion, it might be expected that no more than one output 352 would indicate a match between its stored address portion and the address portion received from the signal nodes 354. In this manner, the output 352 indicating a match might serve to indicate that the redundant memory element corresponding to the row 340 generating that output 352 should be accessed instead of the defective memory element corresponding to the address portion received on the signal nodes 354.

Prior repair logic and control circuitry might utilize an encoder responsive to the outputs 352 to generate an address portion corresponding to the redundant memory element for the row 340 indicating a match on its output 352. Encoders for such uses might typically have been formed of complex combination logic circuits, generating an output of j+1 unique combinations of i+1 digits within a defined address space from an input of j digits having a particular logic level (e.g., a logic low level), and 1 digit having a different logic level (e.g., a logic high level). Such circuits might utilize a significant area of the peripheral circuitry of a memory.

FIG. 3B depicts an encoder 356 and multiplexer (MUX) 360 used to generate an address portion for a redundant memory element if a match is indicated by one of the match signal generators 350 of FIG. 3A, and to select the address portion for the redundant memory element if the match is indicated, or to select the address portion received on the signal nodes 354 if no match is indicated. The encoder 356 is responsive to the outputs $352_0$ to $352_j$, which might be referred to as outputs 352[j:0], to generate i+1 address signals at an output 358[i:0] corresponding to an address portion of a redundant memory element corresponding to a row 340 having an output 352 indicating a match. The multiplexer 360 is connected to receive the i+1 address signals from the output 358[i:0] and to receive the i+1 address signals from the signal nodes 354[i:0]. The multiplexer 360 is responsive to a control signal from control signal node 364 to select the address signals from the signal nodes 354[i:0] for output if no match is indicated, and to select the address signals from the output 358[i:0] of the encoder 356 if a match is indicated. The selected address signals are then provided at an output 362[i:0], e.g., for input to column decode circuitry 110.

For example, the signal received at the control signal node 364 might correspond to an output of an OR gate (not shown) receiving the outputs $352_0$ to $352_j$ as inputs. In this manner, a logic low level from the OR gate might indicate no match in order to select the address signals from the signal nodes 354[i:0], while a logic high level from the OR gate might indicate a match in order to select the address signals from the encoder 356. Alternatively, where a particular digit of the address portion represented by the output 358[i:0], e.g., the $i^{th}$ digit from the output 358[i:0], has a particular value when a match is indicated, and a different value when no match is indicated, this digit of the address portion could be used as the control signal at the control signal node 364.

Figure 4A:
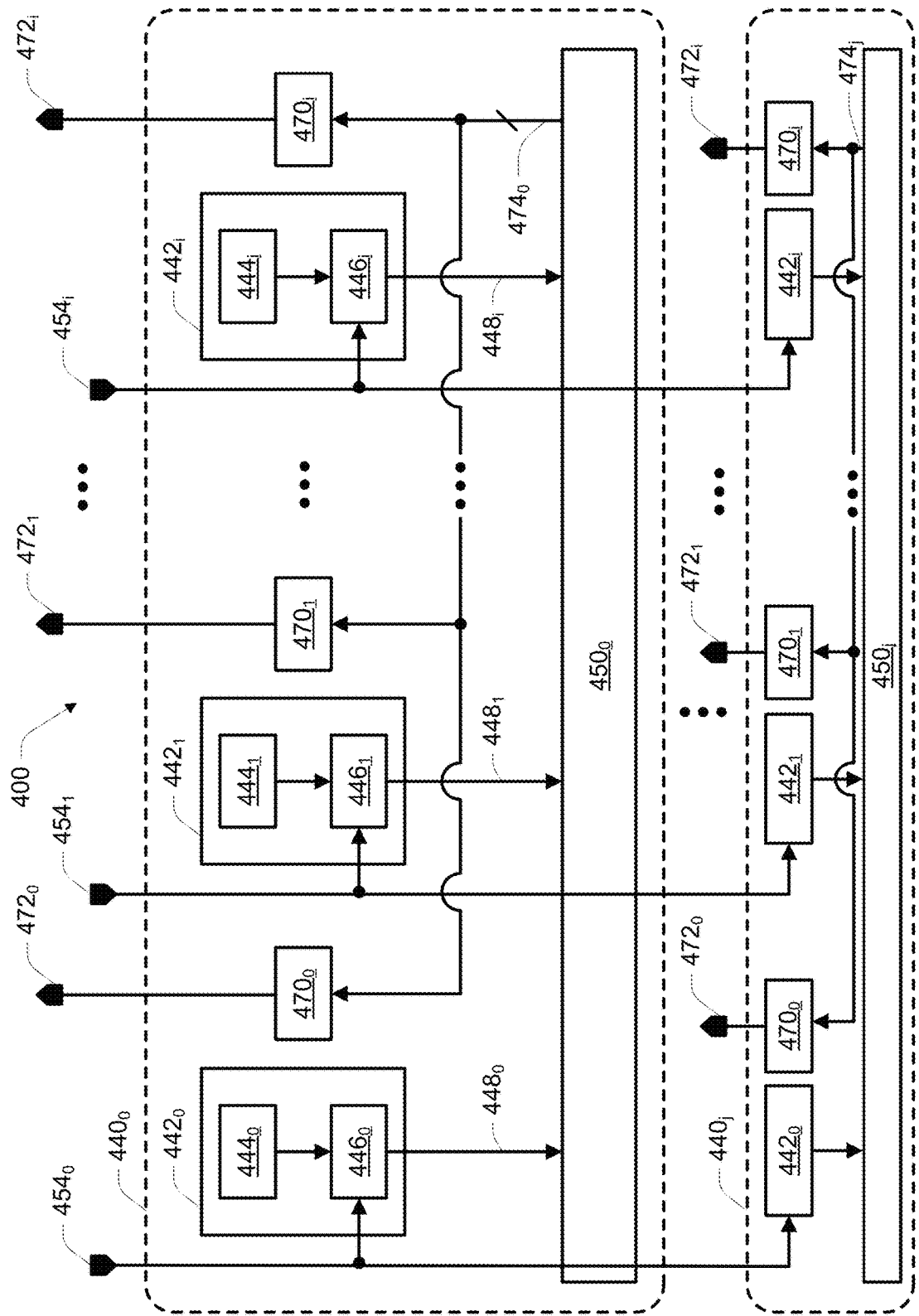

FIGS. 4A-4D are block schematics of repair logic and control circuitry in accordance with embodiments. FIG. 4A depicts an array of content-addressable memory (CAM) cells 400 as a portion of a repair logic and control circuitry in accordance with an embodiment. The array of CAM cells 400 might have a number of rows 440, e.g., rows $440_0$ to $440_j$, where j is any natural number, i.e., a non-negative integer value. Each row 440 of the array of CAM cells 400 might include a number of CAM cells 442, e.g., CAM cells $442_0$ to $442_i$, wherein i is any natural number. Each row 440 of the array of CAM cells 400 might be referred to as a grouping of CAM cells 442. In general, the value of i might be selected such that i+1 is equal to a number of digits of an address portion to be stored to the array of CAM cells 400. For example, for column redundancy, the address portion might correspond to the column address of the memory cells addressed for access. In this example, each row 440 of the array of CAM cells 400 might correspond to a different column address.

The CAM cells 442 generally might each be configured to store a data value, e.g., corresponding to a digit of an address signal, and to provide an output signal having a logic level representative of whether or not a received signal value matches the stored data value. For example, each CAM cell 442 might include a register 444, e.g., registers $444_0$ to $444_i$, in communication with, e.g., connected to, a corresponding compare logic 446, e.g., compare logic $446_0$ to $446_i$, respectively. Each compare logic 446 might be connected to receive a signal value from a corresponding signal node 454, e.g., signal nodes $454_0$ to $454_i$, respectively. The signal nodes 454, which might be referred to as signal nodes 454[i:0], might each be connected to receive a corresponding digit of an address signal, such as from the address register 114 of FIG. 1, for example. Each compare logic 446 might be configured to generate a signal at its output 448, e.g., outputs $448_0$ to $448_i$, respectively, having a first logic level if the data value (e.g., logic level) stored in its register 444 is deemed to be the same as (e.g., equal to) a signal value (e.g., logic level) received from its corresponding signal node 454 (referred to as a match), and a second logic level, different than (e.g., opposite of) its first logic level, if the data value stored in its register 444 is deemed to be different than the signal value received from its corresponding signal node 454 (referred to as a mis-match). For example, each compare logic 446 might represent an XOR gate or an XNOR gate.

Programming the registers 444 of one or more rows 440 might include accessing (e.g., reading) a particular portion of an array of memory cells 104 storing address portions corresponding to defective memory elements. In general, testing of a memory might be used to determine which memory elements are deemed to be usable, and which are deemed to be defective. When a memory element is deemed to be defective, an address portion corresponding to that memory element might be stored to a non-volatile storage location of the memory, e.g., the array of memory cells 104.

These address portions might then be accessed during power-up of the memory to program the registers 444 accordingly.

The outputs 448 of each CAM cell 442 of a row 440 of the array of CAM cells 400 might be connected to a match signal generator 450 corresponding to that row 440. Each row 440$_0$ to 440$_j$ might have a corresponding match signal generator 450, e.g., match signal generators 450$_0$ to 450$_j$, respectively, in the same manner as depicted in row 440$_0$. Each match signal generator 450 might be configured to generate an indication at its output 474, e.g., outputs 474$_0$ to 474$_j$, respectively, indicative of whether a match is indicated between the signals received from the signal nodes 454$_0$ to 454$_i$, and the values stored in the registers 444$_0$ to 444$_i$ of the corresponding row 440.

As one example, the indication might be a signal having a first logic level if each of the outputs 448 of its corresponding CAM cells 442 indicates a match, and having a second logic level, different than (e.g., opposite of) its first logic level if any of the outputs 448 of its corresponding CAM cells 442 indicates a mis-match. For example, if its CAM cells 442 indicate a match with a logic high level, the match signal generator 450 might represent an AND gate or a NAND gate. Conversely, if its CAM cells indicate a match with a logic low level, the match signal generator 450 might represent an OR gate or a NOR gate. Note that the first logic level for the output 474 of a match signal generator 450 might be the same as, or different from, the first logic level for the output 448 of a CAM cell 442. Each row 440 of the array of CAM cells 400 might be configured in a same manner as depicted with regard to row 440$_0$, with each compare logic 446$_0$ to 446$_i$ connected to its corresponding signal node 454$_0$ to 454$_i$, respectively.

Alternatively, the indication of a match signal generator 450 might include a pair of complementary signals, where a first signal of the pair of complementary signals has the first logic level, and the second signal of the pair of complementary signals has the second logic level, if each of the outputs 448 of its corresponding CAM cells 442 indicates a match, and where the first signal of the pair of complementary signals has the second logic level, and the second signal of the pair of complementary signals has the first logic level, if any of the outputs 448 of its corresponding CAM cells 442 indicates a mis-match.

In practice, an address portion for a corresponding defective memory element, e.g., a column of memory cells containing one or more memory cells identified as being defective, might be stored in the CAM cells 442 of a row 440 of the array of CAM cells 400. Each row 440 of the array of CAM cells 400 might store a different address portion, each corresponding to a different defective memory element. It is noted that where a number of identified defective memory elements is less than the number of rows 440 of the array of CAM cells 400, one or more of the rows 440 might not store any address portion, but might instead store values not corresponding to any accessible address. For example, values of all logic low levels or all logic high levels might not correspond to any address to be received on the signal nodes 454. In this manner, a row 440 of the array of CAM cells 400 not corresponding to a defective memory element might be configured to always indicate a mis-match in response to an address received on the signal nodes 454.

Each row 440 storing an address portion might correspond to a respective redundant memory element, and each redundant memory element might have a corresponding address portion outside of the address space, e.g., of the array of memory cells 104, that might be received on the signal nodes 454. For example, assuming i=7, valid addresses to be received from the signal nodes 454 might correspond to an address space contained in 00000000 to 01111111, while addresses for redundant memory elements might correspond to an address space beginning with 10000000. With each row 440 storing a different address portion, or not storing any valid address portion, it might be expected that no more than one output 474 would indicate a match between its stored address portion and the address portion received from the signal nodes 454. In this manner, the output 474 indicating a match might serve to indicate that the redundant memory element corresponding to the row 440 generating that output 474 should be accessed instead of the defective memory element corresponding to the address portion received on the signal nodes 454.

Instead of utilizing an encoder to generate an address of a redundant memory element, various embodiments include selectively-activated storage elements 470, e.g., storage elements 470$_0$ to 470$_1$, corresponding to each row 440. The storage elements 470 for a particular row 440 each might be configured to store a value of a respective digit of the address portion of the redundant memory element for that row 440. The storage elements 470 might be responsive to the indication on the output 474 of their corresponding match signal generator 450. For example, the storage elements 470, e.g., storage elements 470$_0$ to 470$_i$, each might be configured to generate a signal on its respective output 472, e.g., outputs 472$_0$ to 472$_i$, respectively, corresponding to its respective digit of the address portion of the corresponding redundant memory element for that row 440 when the indication on its corresponding output 474 indicates a match for that row 440, and to present a high-impedance, e.g., high Z, when the indication on its corresponding output 474 indicates a mis-match for that row 440. Each output 472$_0$ to 472$_i$ of one row 440 might be commonly connected to the corresponding outputs 472$_0$ to 472$_i$, respectively, of each remaining row 440.

Although the storage elements 470 are depicted to be in close physical proximity to their corresponding CAM cells 442, the storage element 470 could be located away from their corresponding CAM cells 442 provided they are in communication with their corresponding match signal generator 450, and there need not be any connection to the CAM cells 442 themselves.

Programming the storage elements 470 of one or more rows 440 might include accessing (e.g., reading) a particular portion of an array of memory cells 104 storing address portions corresponding to redundant memory elements. As previously noted, testing of a memory might be used to determine which memory elements are deemed to be usable, and which are deemed to be defective. When a memory element is deemed to be defective, an address portion corresponding to that memory element might be stored to a non-volatile storage location of the memory, e.g., the array of memory cells 104. Similarly, a redundant memory element might be assigned to replace the defective memory element. Address portions for the redundant memory elements might be assigned prior to or subsequent to determining addresses of defective memory elements. These address portions might then be accessed during power-up of the memory to program the storage elements 470 accordingly. Alternatively, the address portions for the redundant memory elements might be hard coded into the circuitry as discussed with reference to FIGS. 6A-6C.

FIG. 4B depicts a multiplexer (MUX) 460 used to select the address portion for the redundant memory element if a match is indicated by one of the match signal generators 450 of FIG. 4A, or to select the address portion received on the signal nodes 454 if no match is indicated. The multiplexer 460 is connected to receive the i+1 address signals from the outputs 472[i:0] and to the receive i+1 address signals from the signal nodes 454[i:0]. The multiplexer 460 is responsive to a control signal from control signal node 464 to select the address signals from the signal nodes 454[i:0] for output if no match is indicated, and to select the address signals from the outputs 472[i:0] if a match is indicated. The selected address signals are then provided at an output 462[i:0], e.g., for input to column decode circuitry 110.

For example, the signal received at the control signal node 464 might correspond to an output of an OR gate (not shown) receiving the outputs $472_0$ to $472_j$ as inputs. In this manner, a logic low level from the OR gate might indicate no match in order to select the address signals from the signal nodes 454[i:0], while a logic high level from the OR gate might indicate a match in order to select the address signals from the outputs 472[i:0]. Alternatively, where a particular digit of the address portion represented by the outputs 472[i:0], e.g., the $i^{th}$ digit from the outputs 472[i:0], has a particular value when a match is indicated, and a different value when no match is indicated, this digit of the address portion could be used as the control signal at the control signal node 464. The $i^{th}$ digit from the outputs 472[i:0] might correspond to a most significant digit of the address portion.

FIG. 4C depicts a common connection of the outputs 472[i:0] among the storage elements 470 across multiple rows 440. For example, FIG. 4C depicts the output $472_x$ connected to storage elements $470_{x(z-1)}$, $470_{xz}$, and $470_{x(z+1)}$, which might correspond to storage elements $470_x$ for rows $440_{z-1}$, $440_z$, and $440_{z+1}$, respectively. With reference to FIG. 4A, x might represent any natural number from 0 to i, and z might represent any natural number from 1 to j−1.

FIG. 4D depicts an output $474_y$ providing a pair of complementary signals, e.g., on outputs $474_{0y}$ and $474_{1y}$, where the output $474_{1y}$ is connected to an output of an inverter $475_y$ that has an input connected to the match signal generator $450_y$. With reference to FIG. 4A, y might represent any natural number from 0 to j. In this manner, the output $474_{y0}$ might provide a first signal having its first logic level if each of the outputs 448 of its corresponding CAM cells 442 indicates a match, and having its second logic level if any of the outputs 448 of its corresponding CAM cells 442 indicates a mis-match. Similarly, the output $474_{y1}$ might provide a second signal having its second logic level if each of the outputs 448 of its corresponding CAM cells 442 indicates a match, and having its first logic level if any of the outputs 448 of its corresponding CAM cells 442 indicates a mis-match.

Figure 5:
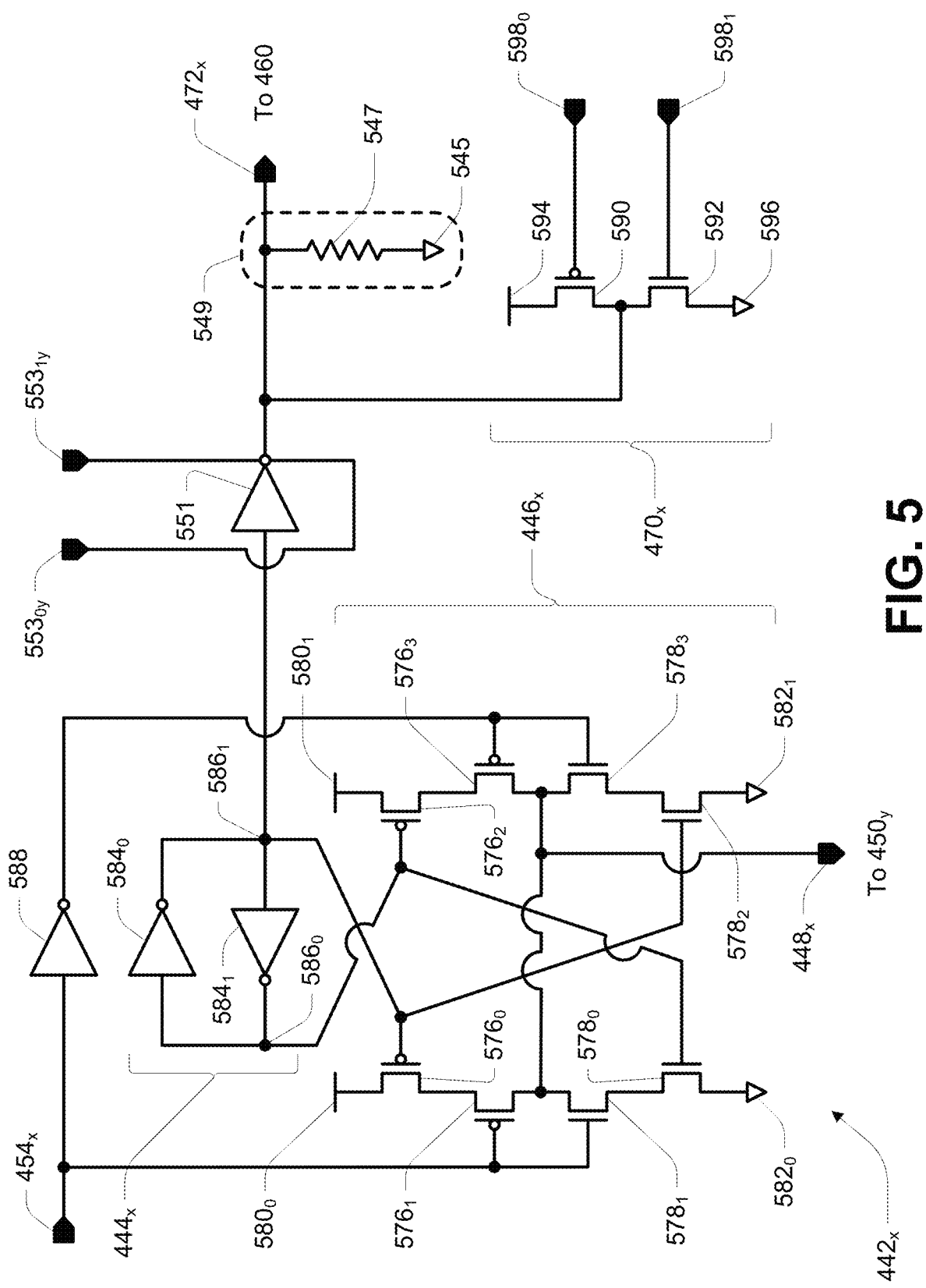
FIG. 5 is a schematic of a content-addressable memory cell and associated storage element for communication with a match signal generator in accordance with an embodiment.

FIG. 5 is a schematic of a CAM cell $442_x$ and associated storage element $470_x$ for communication with a match signal generator $450y$ (e.g., of a row $440y$) in accordance with an embodiment. The CAM cell $442_x$ might represent any CAM cell $442_0$ to $442_i$ of FIG. 4A corresponding to a match signal generator $450_y$, where the match signal generator $450_y$ might represent any match signal generator $450_0$ to $450_j$ of FIG. 4A, for example. For example, with reference to FIG. 4A, x might represent any natural number from 0 to i, and y might represent any natural number from 0 to j.

The CAM cell $442_x$ might include a register $444_x$ and a compare logic $446_x$. The register $444_x$ might include a pair of cross-coupled inverters $584_0$ and $584_1$. The data value stored in the register $444_x$ might be represented by a logic level at its node $586_0$. The compare logic $446_x$ might include an XOR gate, providing a logic low level at its output $448_x$ when the data value of the register $444_x$ is equal to (e.g., has a same logic level as) the signal value received at its corresponding signal node $454_x$, and providing a logic high level at its output $448_x$ when the data value of the register $444_x$ is different than (e.g., has a different logic level than) the signal value received at its corresponding signal node $454_x$.

The register $444_x$ of FIG. 5 has been simplified by not depicting circuitry for setting and resetting the cross-coupled inverters $584_0$ and $584_1$, e.g., for storing one data value or another to the register $444_x$. However, circuitry for setting or resetting a pair of cross-coupled inverters is well understood in the relevant art, and an example of suitable circuitry is presented in FIG. 6D for a different pair of cross-coupled inverters.

Referring back to FIG. 5, the compare logic $446_x$ might include a first pFET $576_0$ having a first source/drain connected to a voltage node $580_0$ and a control gate connected to the node $586_1$ of the register $444_x$. The voltage node $580_0$ might be configured to receive a top-rail supply voltage, such as the supply voltage Vcc. The compare logic $446_x$ might further include a second pFET $576_1$ having a first source/drain connected to a second source/drain of the pFET $576_0$, a control gate connected to the signal node $454_x$, and a second source/drain connected to the output $448_x$.

The compare logic 446x might further include a first nFET $578_0$ having a first source/drain connected to a voltage node $582_0$ and a control gate connected to the node $586_0$. The voltage node $582_0$ might be configured to receive a bottom-rail supply voltage, e.g., a reference potential, such as the supply voltage Vss, which might be ground or 0V. The compare logic $446_x$ might further include a second nFET $578_1$ having a first source/drain connected to a second source/drain of the nFET $578_0$, a control gate connected to the signal node $454_x$, and a second source/drain connected to the output $448_x$.

The compare logic $446_x$ might further include a third pFET $576_2$ having a first source/drain connected to a voltage node $580_1$ and a control gate connected to the node $586_0$ of the register $444_x$, and connected to the control gate of the first nFET $578_0$. The voltage node $580_1$ might be configured to receive a top-rail supply voltage, such as the supply voltage Vcc. The compare logic $446_x$ might further include a fourth pFET $576_3$ having a first source/drain connected to a second source/drain of the pFET $576_2$, a control gate connected to an output of an inverter 588 having an input connected to the signal node $454_x$, and a second source/drain connected to the output $448_x$.

The compare logic $446_x$ might further include a third nFET $578_2$ having a first source/drain connected to a voltage node $582_1$ and a control gate connected to the node $586_1$, and connected to the control gate of the first pFET $576_0$. The voltage node $582_1$ might be configured to receive a bottom-rail supply voltage, e.g., a reference potential, such as the supply voltage Vss, which might be ground or 0V. The compare logic $446_x$ might further include a fourth nFET $578_3$ having a first source/drain connected to a second source/drain of the nFET $578_2$, a control gate connected to the output of the inverter 588, and a second source/drain connected to the output $448_x$.

The storage element $470_x$ might include a pFET 590 having a first source/drain connected to a voltage node 594, a second source/drain connected to the output $472_x$, and a control gate connected to a first control signal node $598_0$. The voltage node 594 might be configured to receive a top-rail supply voltage, such as the supply voltage Vcc. The storage element $470_x$ might further include an nFET 592 having a first source/drain connected to a voltage node $596$, a second source/drain connected to the output $472_x$, and a control gate connected to a second control signal node $598_1$. The voltage node $596$ might be configured to receive a bottom-rail supply voltage, e.g., a reference potential, such as the supply voltage Vss, which might be ground or 0V. One of the control signal nodes $598_0$ or $598_1$ might be configured to receive a control signal indicative of whether its corresponding match signal generator $450_y$ indicates a match, while the other control signal node $598_1$ or $598_0$, respectively, might be configured to receive a fixed control signal regardless of whether its corresponding match signal generator $450_y$ indicates a match. Additional detail will be provided with reference to FIGS. 6A-6D.

FIG. 5 further depicts a bias element $549$ that might be connected to the output $472_x$. The bias element $549$ is depicted as a pull-down resistance, e.g., to discharge a logic high level at the output $472_x$ to transition its resting state to a logic low level. In particular, a resistance (e.g., resistor) $547$ has a first end connected to the output $472_x$, and a second end connected to a voltage node $545$. The voltage node $545$ might be configured to receive a bottom-rail supply voltage, e.g., a reference potential, such as the supply voltage Vss, which might be ground or 0V. Alternatively, the bias element $549$ could be a pull-up resistance, e.g., to charge a logic low level at the output $472_x$ to transition its resting state to a logic high level. For a pull-up resistance, the voltage node $545$ might instead be configured to receive a top-rail supply voltage, such as the supply voltage Vcc.

A bias element $549$ might be included to restore the logic states of an output $472_x$ to some known logic level as the output $472_x$ might be electrically floating if its corresponding storage elements $470$ are all at a high impedance state. A bias element $549$ might be used on less than all of the outputs $472[i:0]$. For example, if a digit of the address portion is used as the control signal to the control signal node $464$, e.g., the $i^{th}$ digit, the corresponding output $472_i$ might include a bias element $549$, while remaining outputs $472_0$ to $472_{i-1}$ might not include a bias element $549$ as their resting logic state might be inconsequential. If a logic high level of the $i^{th}$ digit of the address portion indicates a match, and thus a desire to select the address portion for the redundant memory element, the bias element $549$ might be a pull-down resistance such that the control signal node $464$ would indicate a desire to select the received address portion absent the output $472_i$ being actively driven high by one of its corresponding storage elements $470_i$. Alternatively, if a logic low level of the $i^{th}$ digit of the address portion indicates a match, the bias element $549$ might be a pull-up resistance such that the control signal node $464$ would indicate a desire to select the received address portion absent the output $472_i$ being actively driven low by one of its corresponding storage elements $470_i$.

FIG. 5 further depicts a selectively-activated inverter $551$ having an output connected to the output $472_x$ and having an input connected to the node $586_1$ of the register $444_x$. The inverter $551$ might be used to read the register $444x$, e.g., to provide a signal at the output $472_x$ having a same logic level as the node $586_0$, e.g., representing the data value stored to the register $444_x$. The inverter $551$ might be responsive to complementary controls signals received on control signal nodes $553_{0y}$ and $553_{1y}$. For example, when the control signal node $553_{0y}$ has a first logic level and the control signal node $553_{1y}$ has a second logic level, different than the first logic level, the inverter $551$ might generate a signal at its output having the logic level of the node $586_0$, and when the control signal node $553_{0y}$ has the second logic level and the control signal node $553_{1y}$ has the first logic level, the inverter $551$ might be at a high impedance state. The control signal nodes $553_{0y}$ and $553_{1y}$ might be common for each register $444_x$ of a row $440_y$, thus providing the stored data values for each CAM cell $442$ of a row $440_y$ at the outputs $472[i:0]$. The signal at one of the control signal nodes $553_{0y}$ or $553_{1y}$ might be logically combined with the control signal provided to the node $464$ in order to pass the address signals from the outputs $472[i:0]$ to the outputs $462[i:0]$ of the multiplexer $460$ when either there is a desire to read the registers $444$ of a particular row $440$, or there is an indication of a match from one of the match signal generators $450$.

FIGS. 6A-6D are schematics of storage elements $470_x$ and corresponding logic for communication with a match signal generator $450_y$ (e.g., of a row $440_y$) in accordance with embodiments. With reference to FIG. 4A, x might represent any natural number from 0 to i, and y might represent any natural number from 0 to y.

Figure 6A:
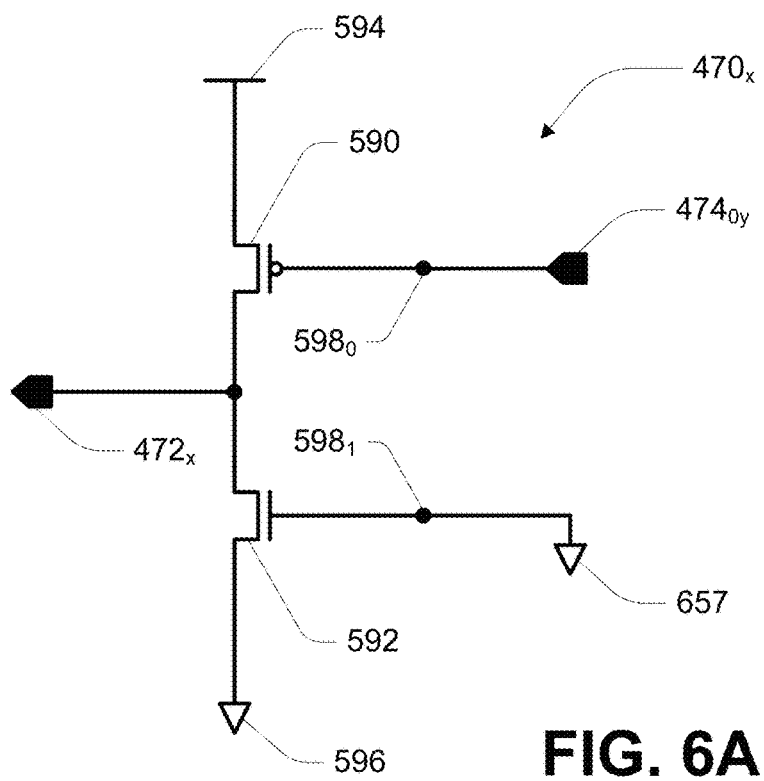
FIGS. 6A-6D are schematics of storage elements and corresponding logic in accordance with embodiments.
Figure 6B:
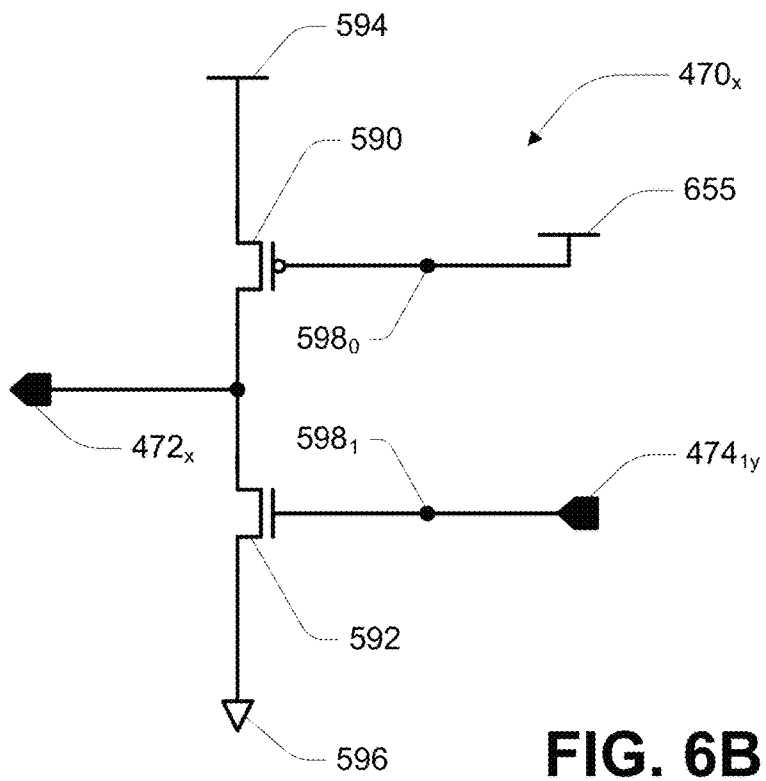

The examples of FIGS. 6A and 6B might represent storage element $470_x$ as hard-wired storage elements storing a logic high level and a logic low level, respectively. The assignment of redundant memory elements to a row $440$ of an array of CAM cells $400$ might occur prior to fabrication of the memory. As such, the circuitry of the storage elements $470$ could be predetermined and simply fabricated to have the connectivity to present a logic high level or a logic low level upon activation.

In the example of FIG. 6A, the first control signal node $598_0$ might be in communication with (e.g., connected to) an output $474_{0y}$ of a match signal generator $450_y$. For such an embodiment, an indication of a match might be represented by a logic low level on the output $474_{0y}$. The second control signal node $598_1$ might be connected to a voltage node $657$. The voltage node $657$ might be configured to receive a bottom-rail supply voltage, e.g., a reference potential, such as the supply voltage Vss, which might be ground or 0V.

With this connectivity, when the output $474_{0y}$ indicates a match of its corresponding match signal generator $450_y$ by presenting a signal having a logic low level, the pFET $590$ might be activated while the nFET $592$ might be deactivated, thus connecting the output $472x$ to the voltage node $594$. Similarly, if the output $474_{0y}$ presents a signal having a logic high level, e.g., indicating a mis-match, both the pFET $590$ and the nFET $592$ might be deactivated.

In the example of FIG. 6B, the first control signal node $598_0$ might be connected to a voltage node $655$. The voltage node $655$ might be configured to receive a top-rail supply voltage, such as the supply voltage Vcc. The second control signal node $598_1$ might be in communication with (e.g., connected to) an output $474_{1y}$ of a match signal generator $450_y$. For such an embodiment, an indication of a match might be represented by a logic high level on the output $474_{1y}$.

With this connectivity, when the output $474_{1y}$ indicates a match of its corresponding match signal generator $450_y$ by presenting a signal having a logic high level, the nFET $592$ might be activated while the pFET $590$ might be deactivated, thus connecting the output $472_x$ to the voltage node $596$. Similarly, if the output $474_{1y}$ presents a signal having a logic low level, e.g., indicating a mis-match, both the nFET $592$ and the pFET $590$ might be deactivated.

It should be noted that in the example of FIG. 6A, the nFET $592$, voltage node $596$ and voltage node $657$ could be eliminated from the schematic while providing similar functionality of selectively presenting a logic high level at the output $472_x$, and that in the example of FIG. 6B, the pFET $590$, voltage node $594$ and voltage node $655$ could be eliminated from the schematic while providing similar functionality of selectively presenting a logic low level at the output $472_x$.

Figure 6C:
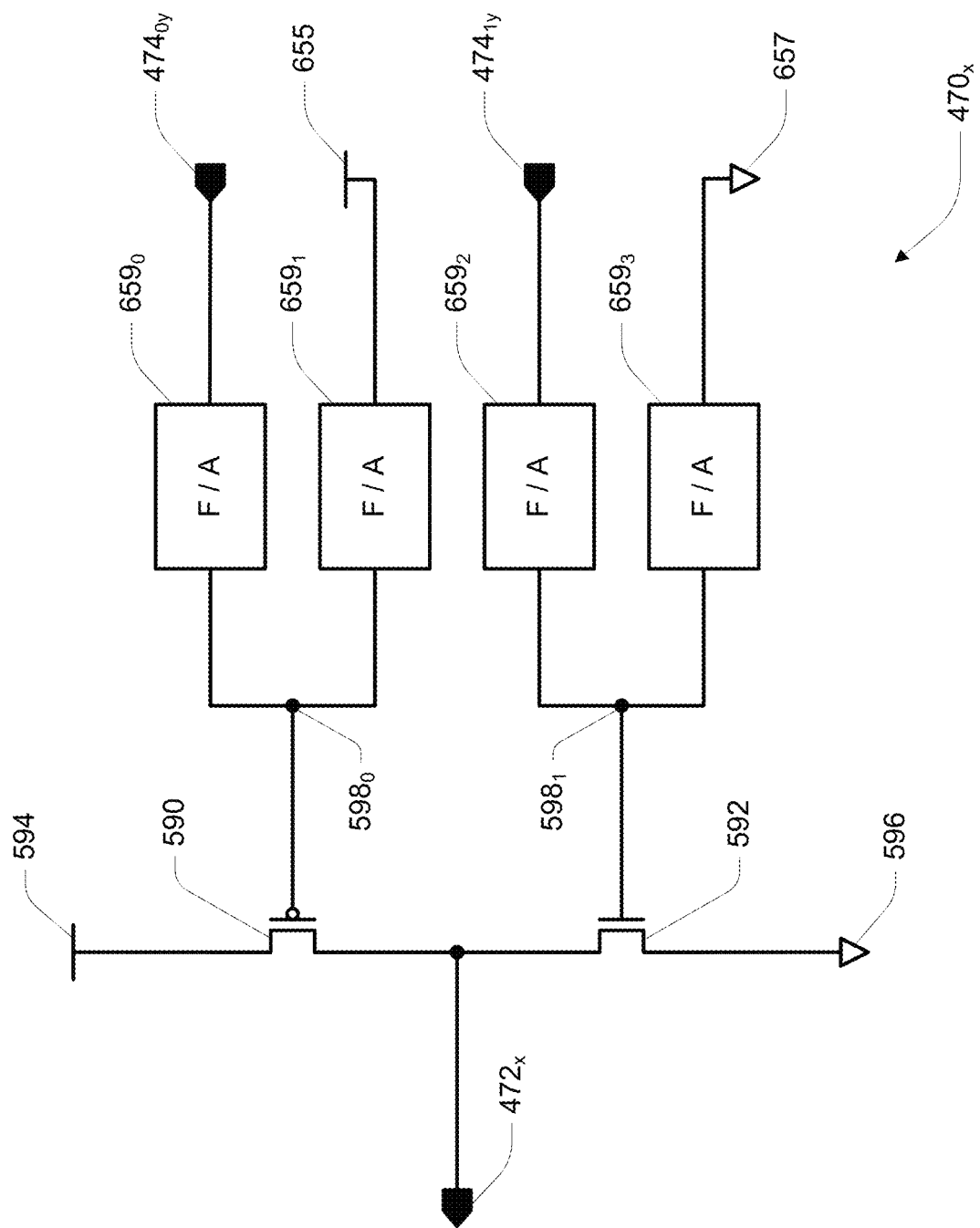

The example of FIG. 6C might represent a storage element $470_x$ as a read-only storage element. In particular, the first control signal node $598_0$ might be connected to an output of a first programmable element $659_0$ and to an output of a second programmable element $659_1$. The second control signal node $598_1$ might be connected to an output of a third programmable element $659_2$ and to an output of a fourth programmable element $659_3$.

The first programmable element $659_0$ might have an input in communication with (e.g., connected to) an output $474_{0y}$ of a match signal generator $450_y$. For such an embodiment, an indication of a match might be represented by a logic low level on the output $474_{0y}$. The second programmable element $659_1$ might have an input connected to a voltage node 655. The voltage node 655 might be configured to receive a top-rail supply voltage, such as the supply voltage Vcc.

The third programmable element $659_2$ might have an input in communication with (e.g., connected to) an output $474_{1y}$ of a match signal generator $450_y$. The fourth programmable element $659_3$ might have an input connected to a voltage node 657. The voltage node 657 might be configured to receive a bottom-rail supply voltage, e.g., a reference potential, such as the supply voltage Vss, which might be ground or 0V.

The programmable elements $659_0$-$659_3$ might each be a fuse or antifuse (F/A) element. Such programmable elements are well understood in the relevant art. In particular, a fuse element normally presents a closed circuit between its input and output, while an antifuse element normally presents an open circuit between its input and output. Through the application of appropriate voltage levels to the programmable element, a fuse element can be altered (e.g., permanently altered) to present an open circuit between its input and output, or an antifuse element can be altered (e.g., permanently altered) to present a closed circuit between its input and output.

Programming the storage element $470_x$ of FIG. 6C to store a logic high level might include programming the first programmable element $659_0$ to present a closed circuit, programming the second programmable element $659_1$ to present an open circuit, programming the third programmable element $659_2$ to present an open circuit, and programming the fourth programmable element $659_3$ to present a closed circuit. In this manner, when the output $474_{0y}$ indicates a match of its corresponding match signal generator $450_y$ by presenting a signal having a logic low level, the pFET 590 might be activated while the nFET 592 might be deactivated, thus connecting the output $472_x$ to the voltage node 594. Similarly, if the output $474_{0y}$ presents a signal having a logic high level, e.g., indicating a mis-match, both the pFET 590 and the nFET 592 might be deactivated.

Programming the storage element $470_x$ of FIG. 6C to store a logic low level might include programming the first programmable element $659_0$ to present an open circuit, programming the second programmable element $659_1$ to present a closed circuit, programming the third programmable element $659_2$ to present a closed circuit, and programming the fourth programmable element $659_3$ to present an open circuit. In this manner, when the output $474_{1y}$ indicates a match of its corresponding match signal generator $450_y$ by presenting a signal having a logic high level, the nFET 592 might be activated while the pFET 590 might be deactivated, thus connecting the output $472_x$ to the voltage node 596. Similarly, if the output $474_{1y}$ presents a signal having a logic low level, e.g., indicating a mis-match, both the nFET 592 and the pFET 590 might be deactivated.

Figure 6D:
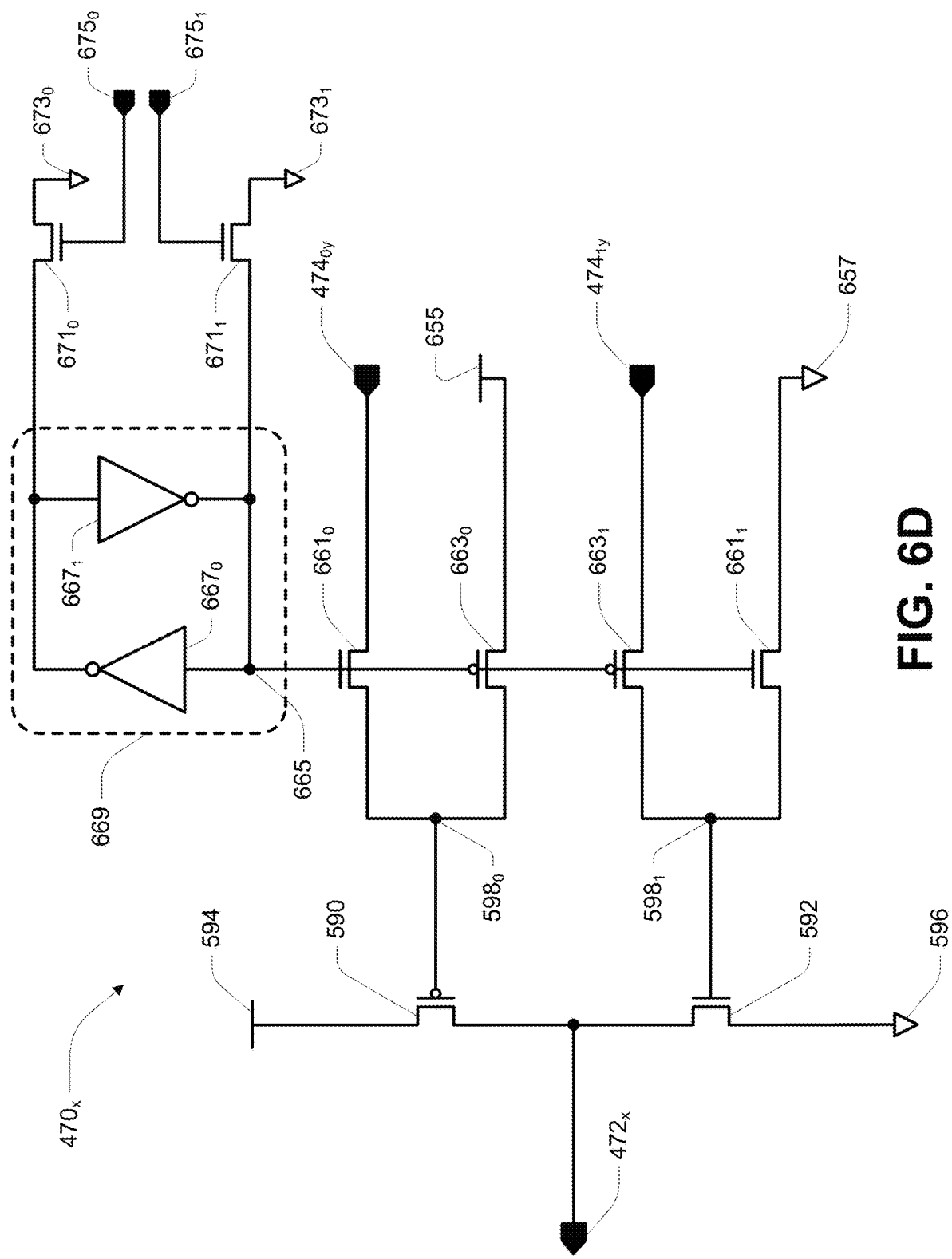

The example of FIG. 6D might represent a storage element $470_x$ as a register-based storage element. In particular, the first control signal node $598_0$ might be connected to a first source/drain of a first nFET $661_0$ and to a first source/drain of first pFET $663_0$. The second control signal node $598_1$ might be connected to a first source/drain of a second nFET $661_1$ and to a first source/drain of second pFET $663_1$.

The first nFET $661_0$ might have a second source/drain in communication with (e.g., connected to) an output $474_{0y}$ of a match signal generator $450_y$. For such an embodiment, an indication of a match might be represented by a logic low level on the output $474_{0y}$. The first pFET $663_0$ might have a second source/drain connected to a voltage node 655. The voltage node 655 might be configured to receive a top-rail supply voltage, such as the supply voltage Vcc.

The second pFET $663_1$ might have a second source/drain in communication with (e.g., connected to) an output $474_{1y}$ of a match signal generator $450_y$. The second nFET $661_1$ might have a second source/drain connected to a voltage node 657. The voltage node 657 might be configured to receive a bottom-rail supply voltage, e.g., a reference potential, such as the supply voltage Vss, which might be ground or 0V.

The first nFET $661_0$, second nFET $661_1$, first pFET $663_0$ and second pFET $663_1$ might each have their control gates in communication with (e.g., connected to) the node 665 of a register 669. The node 665 might be configured to have a logic level corresponding to a data value stored to the register 669. In this example, the register 669 includes a pair of cross-coupled inverters $667_0$ and $667_1$. The input of the inverter $667_1$, and the output of the inverter $667_0$, might be connected to a first source/drain of a first nFET $671_0$. The first nFET $671_0$ might have a second source/drain connected to a first voltage node $673_0$, and might have a control gate connected to a first control signal node $675_0$. The input of the inverter $667_0$, and the output of the inverter $667_1$, might be connected to a first source/drain of a second nFET $671_1$. The second nFET $671_1$ might have a second source/drain connected to a second voltage node $673_1$, and might have a control gate connected to a second control signal node $675_1$. The voltage nodes $673_0$ and $673_1$ each might be configured to receive a bottom-rail supply voltage, e.g., a reference potential, such as the supply voltage Vss, which might be ground or 0V.

Programming the storage element $470_x$ of FIG. 6D to store a logic high level might include momentarily applying a logic high level to the control signal node $675_0$ sufficient to develop a logic high level at the node 665, and otherwise maintaining the control signal nodes $675_0$ and $675_1$ at a logic low level. In this manner, the control signal node $598_0$ might be in communication with the output $474_{0y}$ and isolated from the voltage node 655, and the control signal node $598_1$ might be connected to the voltage node 657 and isolated from the output $474_{1y}$. As such, when the output $474_{0y}$ indicates a match of its corresponding match signal generator $450_y$ by presenting a signal having a logic low level, the pFET 590 might be activated while the nFET 592 might be deactivated, thus connecting the output $472_x$ to the voltage node 594. Similarly, if the output $474_{0y}$ presents a signal having a logic high level, e.g., indicating a mis-match, both the pFET 590 and the nFET 592 might be deactivated.

Programming the storage element $470_x$ of FIG. 6D to store a logic low level might include momentarily applying a logic high level to the control signal node $675_1$ sufficient to develop a logic low level at the node 665, and otherwise maintaining the control signal nodes $675_0$ and $675_1$ at a logic low level. In this manner, the control signal node $598_0$ might be isolated from the output $474_{0y}$ and connected to the voltage node 655, and the control signal node $598_1$ might be isolated from the voltage node 657 and in communication with (e.g., connected to) the output $474_{1y}$. As such, when the output $474_{1y}$ indicates a match of its corresponding match signal generator $450_y$ by presenting a signal having a logic high level, the nFET 592 might be activated while the pFET 590 might be deactivated, thus connecting the output $472_x$ to the voltage node 596. Similarly, if the output $474_{1y}$ presents a signal having a logic low level, e.g., indicating a mismatch, both the nFET 592 and the pFET 590 might be deactivated.

It should be noted that although the examples of FIGS. 6A-6D utilized an indication of a match signal generator having a pair of complementary outputs $474_{0y}$ and $474_{1y}$, an inverter could be added if the indication has only one signal value, in order to convert the logic level of the indication to the appropriate value to selectively activate either the pFET 590 or the nFET 592, depending upon the stored data value.

Figure 7:
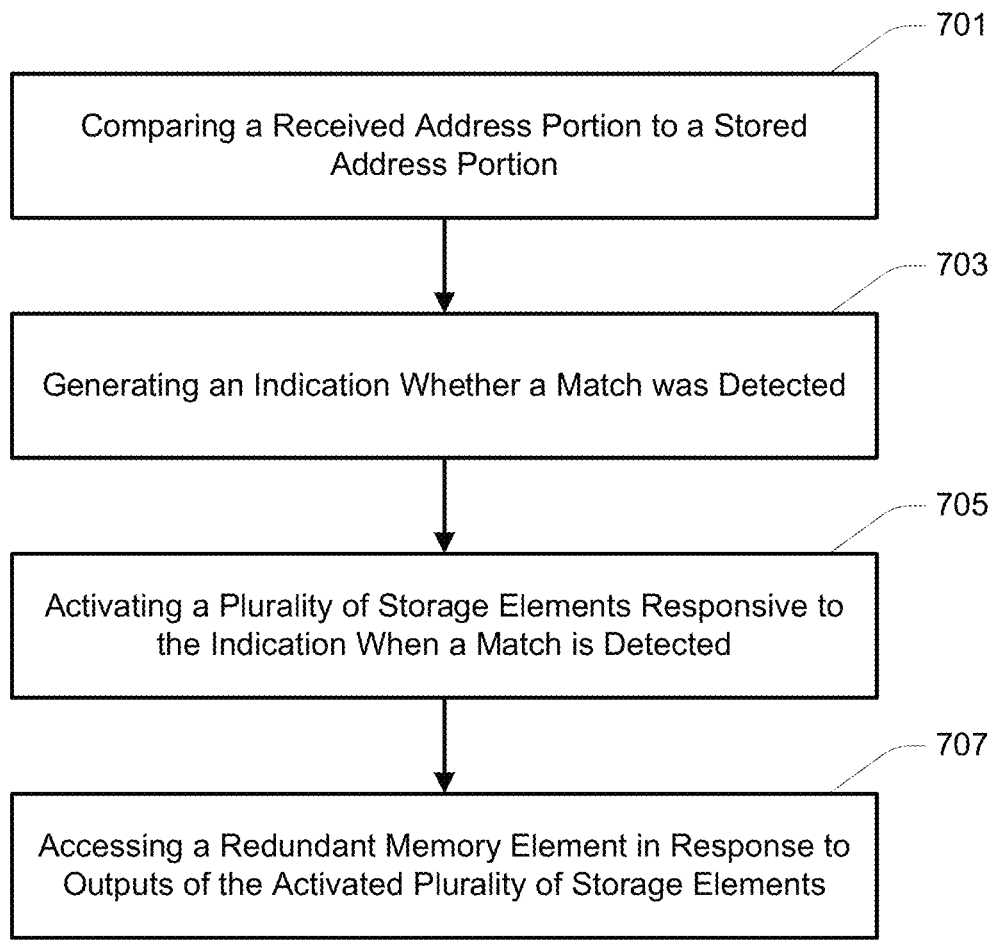
FIG. 7 is a flowchart of a method of operating a memory in accordance with an embodiment.

FIG. 7 is a flowchart of a method of operating a memory in accordance with an embodiment. The method might be in the form of computer-readable instructions, e.g., stored to the instruction registers 128. Such computer-readable instructions might be executed by a controller, e.g., the control logic 116, to cause the memory (e.g., relevant components of the memory) to perform the method. At 701, a received address portion might be compared to a stored address portion. For example, a column address of a memory cell to be accessed might be received at an array of CAM cells, and compared to address portions stored to one or more rows of the array of CAM cells.

At 703, an indication whether a match was detected might be generated. For example, outputs of each row of CAM cells might be provided to a corresponding match signal generator, and each match signal generator might generate an indication whether a match was detected, e.g., whether each of its corresponding CAM cells indicated a match between a respective digit of the stored address portion for that row and a respective digit of the received address portion, or a mis-match was detected, e.g., whether any of its corresponding CAM cells did not indicate a match between a respective digit of the stored address portion for that row and a respective digit of the received address portion.

At 705, a plurality of storage elements might be activated responsive to the indication when a match is detected. For example, each storage element of the plurality of storage elements might present either a signal corresponding to a stored data value when activated, and might present a high-impedance when deactivated. Such activation might be responsive to a logic level of the indication.

At 707, a redundant memory element might be accessed in response to outputs of the activated plurality of storage elements. For example, the outputs of the activated plurality of storage elements might represent an address portion corresponding to a redundant memory element predetermined to be used to replace any access request of a memory element deemed to be defective, and corresponding to the matched received address portion.

CONCLUSION

Although specific embodiments have been illustrated and described herein, it will be appreciated by those of ordinary skill in the art that any arrangement that is calculated to achieve the same purpose might be substituted for the specific embodiments shown. Many adaptations of the embodiments will be apparent to those of ordinary skill in the art. Accordingly, this application is intended to cover any adaptations or variations of the embodiments.

What is claimed is:

1. A memory, comprising:
a plurality of content addressable memory (CAM) cells, wherein each CAM cell of the plurality of CAM cells is configured to store a respective data value;
a match signal generator configured to generate an indication whether each CAM cell of the plurality of CAM cells indicates a match between its respective data value and a respective received signal value; and
a plurality of storage elements, wherein each storage element of the plurality of storage elements corresponds to a respective CAM cell of the plurality of CAM cells in a one-to-one relationship, wherein each storage element of the plurality of storage elements is configured to store a respective data value, and wherein each storage element of the plurality of storage elements is responsive to the indication of the match signal generator to selectively generate a data signal indicative of the respective data value of that storage element.

2. The memory of claim 1, wherein the respective data value of each CAM cell of the plurality of CAM cells corresponds to a digit of an address portion of a defective memory element, and wherein the respective data value of each storage element of the plurality of storage elements corresponds to a digit of an address portion of a redundant memory element.

3. The memory of claim 1, wherein, for at least one storage element of the plurality of storage elements, the respective data value for that storage element is different than the respective data value of its corresponding CAM cell of the plurality of CAM cells.

4. The memory of claim 1, wherein the indication of the match signal generator comprises a signal having a first logic level when in response to each CAM cell of the plurality of CAM cells indicating a match between its respective data value and its respective received signal value, and having a second logic level, different than the first logic level, in response to any CAM cell of the plurality of CAM cells indicating a mis-match between its respective data value and its respective received signal value.

5. The memory of claim 4, wherein the signal of the indication is a first signal, and wherein the indication of the match signal generator further comprises a second signal having the second logic level in response to each CAM cell of the plurality of CAM cells indicating a match between its respective data value and its respective received signal value, and having the first logic level in response to any CAM cell of the plurality of CAM cells indicating a mis-match between its respective data value and its respective received signal value.

6. The memory of claim 5, wherein each storage element of the plurality of storage elements whose respective data value has a particular logic level is responsive to the logic level of the first signal without regard to the logic level of the second signal, and wherein each storage element of the plurality of storage elements whose respective data value has a different logic level, different than the particular logic level, is responsive to the logic level of the second signal without regard to the logic level of the first signal.

7. The memory of claim 6, wherein the particular logic level and the second logic level are a same logic level, and wherein the different logic level and the first logic level are a same logic level.

8. The memory of claim 1, wherein a particular storage element of the plurality of storage elements comprises a first field-effect transistor (FET) having a first source/drain connected to a first voltage node and a second source/drain connected to a first source/drain of a second FET, wherein the second FET has a second source/drain connected to a second voltage node, wherein the first voltage node is configured to receive a first voltage level, wherein the second voltage node is configured to receive a second voltage level lower than the first voltage level, wherein the first FET is configured to be selectively activated in response to the indication if the particular storage element stores a data value having a first logic level and to be deactivated regardless of the indication if the particular storage element stores the data value having a second logic level different than the first logic level, and wherein the second FET is configured to be selectively activated in response to the indication whet-if the particular storage element stores the data value having the second logic level and to be deactivated regardless of the indication if the particular storage element stores the data value having the first logic level.

9. The memory of claim 8, wherein the particular storage element is of a type selected from a group consisting of a hard-wired storage element, a read-only storage element, and a register-based storage element.

10. A memory, comprising:
    an array of content addressable memory (CAM) cells comprising a plurality of groupings of CAM cells, wherein each CAM cell of the array of CAM cells is configured to store a respective data value;
    a plurality of signal nodes, wherein each signal node of the plurality of signal nodes is in communication with a respective CAM cell for each grouping of CAM cells of the plurality of groupings of CAM cells;
    a plurality of match signal generators, wherein each match signal generator of the plurality of match signal generators corresponds to a respective grouping of CAM cells of the plurality of groupings of CAM cells, and wherein each match signal generator of the plurality of match signal generators is configured to generate an indication whether each CAM cell of its respective grouping of CAM cells indicates a match between its respective data value and a signal value received from its respective signal node of the plurality of signal nodes;
    a plurality of groupings of storage elements, wherein each grouping of storage elements of the plurality of groupings of storage elements corresponds to a respective grouping of CAM cells of the plurality of groupings of CAM cells and to the respective match signal generator for that respective grouping of CAM cells; and
    a multiplexer having a first plurality of inputs, and having a plurality of outputs, wherein each input of the first plurality of inputs is in communication with a respective signal node of the plurality of signal nodes, and wherein each input of the second plurality of inputs is in communication with the output of a respective storage element of each grouping of storage elements of the plurality of groupings of storage elements;
    wherein each storage element of the plurality of groupings of storage elements corresponds to a respective CAM cell of its respective grouping of CAM cells in a one-to-one relationship, wherein each storage element of the plurality of groupings of storage elements is configured to store a respective data value, and wherein each storage element of the plurality of groupings of storage elements is responsive to the indication of its match signal generator to generate a data signal on an output of that storage element indicative of the respective data value of that storage element in response to the indication of the respective match signal generator for that storage element indicating a match, and to present a high impedance to the output of that storage element in response to the indication of the respective match signal generator for that storage element indicating a mis-match; and
    wherein the multiplexer is configured to connect its plurality of outputs to the first plurality of inputs in response to no match signal generator of the plurality of match signal generators indicating a match, and to connect its plurality of outputs to the second plurality of inputs in response to any match signal generator of the plurality of match signal generators indicating a match.

11. The memory of claim 10, wherein the multiplexer is responsive to a logic level of an input of the second plurality of inputs to determine whether a match signal generator of the plurality of match signal generators indicates a match.

12. The memory of claim 10, wherein, for each storage element of a particular grouping of storage elements of the plurality of groupings of storage elements, the output of that storage element is commonly connected to a respective storage element of each remaining grouping of storage elements of the plurality of groupings of storage elements.

13. The memory of claim 10, wherein, for each match signal generator of the plurality of match signal generators, the indication for that match signal generator comprises a pair of complementary signals.

14. The memory of claim 13, wherein, for each storage element of the plurality of storage elements, that storage element is responsive to a first signal of the pair of complementary signals if that storage element stores a first data value, and is responsive to a second signal of the pair of complementary signals if that storage element stores a second data value, different than the first data value.

15. A method of operating a memory, comprising:
    comparing a received address portion to a stored address portion;
    generating an indication whether a match was detected between the received address portion and the stored address portion;
    activating a plurality of storage elements responsive to the indication indicating that a match between the received address portion and the stored address portion is detected, wherein activating the plurality of storage elements comprises, for each storage element of the plurality of storage elements, causing that storage element to generate a respective address signal at an output of that storage element; and
    accessing a redundant memory element in response to the outputs of the activated plurality of storage elements.

16. The method of claim 15, wherein comparing the received address portion to the stored address portion comprises comparing a received address portion corresponding to a memory element of the memory to be accessed to a stored address portion corresponding to a memory element of the memory deemed to be defective.

17. The method of claim 15, wherein activating the plurality of storage elements comprises activating a plurality of storage elements collectively storing an address portion corresponding to the redundant memory element.

18. The method of claim 15, wherein the stored address portion is a first stored address portion, wherein the indication is a first indication, wherein the plurality of storage elements is a first plurality of storage elements, and wherein the redundant memory element is a first redundant memory element, the method further comprising:

comparing the received address portion to a second stored address portion;

generating a second indication whether a match was detected between the received address portion and the second stored address portion;

deactivating the first plurality of storage elements responsive to the first indication indicating that a mis-match between the received address portion and the first stored address portion is detected;

activating a second plurality of storage elements responsive to the second indication indicating that a match between the received address portion and the second stored address portion is detected;

deactivating the second plurality of storage elements responsive to the first indication indicating that a mis-match between the received address portion and the first stored address portion is detected; and accessing a second redundant memory element in response to outputs of the activated second plurality of storage elements.

19. The method of claim 18, wherein, for each storage element of the first plurality of storage elements, the output of that storage element is connected to the output of a corresponding storage element of the second plurality of storage elements.

20. The method of claim 15, further comprising:

deactivating the plurality of storage elements responsive to the indication indicating that a mis-match between the received address portion and the stored address portion is detected.

21. The method of claim 20, wherein deactivating the plurality of storage elements comprises, for each storage element of the plurality of storage elements, presenting a high impedance to the output of that storage element.

* * * * *

UNITED STATES PATENT AND TRADEMARK OFFICE
CERTIFICATE OF CORRECTION

| | |
|---|---|
| PATENT NO. | : 11,710,531 B2 |
| APPLICATION NO. | : 17/110407 |
| DATED | : July 25, 2023 |
| INVENTOR(S) | : Iizuka |

It is certified that error appears in the above-identified patent and that said Letters Patent is hereby corrected as shown below:

In the Claims

Column 21, Line 23, Claim 8, delete "indication whet-if the particular" and insert in place thereof --indication if the particular--

Column 21, Line 56, Claim 10, delete "inputs, and having" and insert in place thereof --inputs, having a second plurality of inputs, and having--

Signed and Sealed this
Thirtieth Day of July, 2024

*Katherine Kelly Vidal*

Katherine Kelly Vidal
*Director of the United States Patent and Trademark Office*